(12) United States Patent
Shi et al.

(10) Patent No.: US 10,666,744 B2
(45) Date of Patent: May 26, 2020

(54) MANAGING DISCOVERY AND SELECTION OF SERVICE INTERFACE SPECIFICATIONS

(71) Applicant: The MathWorks, Inc., Natick, MA (US)

(72) Inventors: Qingmin Shi, Sudbury, MA (US); Sankalp S. Modi, Acton, MA (US); Peter S. Szpak, Newton, MA (US); Hidayet T. Simsek, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 126 days.

(21) Appl. No.: 15/995,495

(22) Filed: Jun. 1, 2018

(65) Prior Publication Data

US 2019/0370028 A1  Dec. 5, 2019

(51) Int. Cl.
*G06F 9/44*      (2018.01)
*H04L 29/08*     (2006.01)
(Continued)

(52) U.S. Cl.
CPC ............... *H04L 67/16* (2013.01); *G06F 8/10* (2013.01); *G06F 9/451* (2018.02); *G06F 9/5088* (2013.01);
(Continued)

(58) Field of Classification Search
CPC ......... G09G 5/00; G06F 9/451; G06F 16/338; G06F 8/34; G06F 8/10; G06F 16/24522;
(Continued)

(56) References Cited

U.S. PATENT DOCUMENTS 6,023,578 A * 2/2000 Birsan ............... G06F 8/10
717/105
7,752,559 B1 * 7/2010 Szpak ............... G06F 8/10
715/735
(Continued)

OTHER PUBLICATIONS

Charrada, Eya Ben, David Caspar, Cédric Jeanneret and Martin Glinz. "Towards a benchmark for traceability." EVOL/IWPSE (2011).
(Continued)

*Primary Examiner* — Tuan A Vu
(74) *Attorney, Agent, or Firm* — Young Basile Hanlon & MacFarlane, P.C.

(57) ABSTRACT

A first request is received for one or more service interface specifications. The first request includes information about one or more model element interface specifications usable for identifying the service interface specifications. The model element interface specifications are part of or extracted from one or more executable model elements of an executable graphical model. The service interface specifications correspond to respective services that include features complying with the model element interface specifications and are associated with information necessary for implementing semantics of the model elements. The information about the model element interface specifications is analyzed, comprising evaluating semantics of the executable model elements within the executable graphical model. The service interface specifications are identified based on the analyzing. Information is provided representing the identified service interface specifications for display and selection. A selection of at least one of the identified service interface specifications is stored after the selection is made.

17 Claims, 12 Drawing Sheets

(51) Int. Cl.
  *G06F 9/451*  (2018.01)
  *G06F 8/10*  (2018.01)
  *G06F 9/50*  (2006.01)
  *H04L 29/06*  (2006.01)
  *G06F 30/00*  (2020.01)

(52) U.S. Cl.
  CPC .............. *G06F 30/00* (2020.01); *H04L 67/10* (2013.01); *H04L 67/2809* (2013.01); *H04L 67/42* (2013.01)

(58) Field of Classification Search
  CPC .... G06F 17/2241; G06F 9/5088; G06F 67/16; G06F 67/10; G06N 5/04
  See application file for complete search history.

(56) References Cited

U.S. PATENT DOCUMENTS

| | | | | |
|---|---|---|---|---|
| 8,019,579 | B1* | 9/2011 | Wey | G06F 9/451 703/6 |
| 9,098,547 | B1* | 8/2015 | Zander | G06F 16/24522 |
| 9,142,184 | B1* | 9/2015 | Tiwari | G09G 5/00 |
| 2003/0084156 | A1* | 5/2003 | Graupner | G06F 9/5088 709/226 |
| 2007/0255702 | A1* | 11/2007 | Orme | G06F 16/338 |
| 2008/0189679 | A1* | 8/2008 | Rodriguez | G06F 8/34 717/105 |
| 2009/0138415 | A1* | 5/2009 | Lancaster | G06N 5/04 706/11 |
| 2011/0060980 | A1* | 3/2011 | Tuschner | G06F 17/2241 715/205 |
| 2011/0161391 | A1 | 6/2011 | Araujo et al. | |
| 2011/0307897 | A1 | 12/2011 | Atterbury et al. | |
| 2013/0024834 | A1 | 1/2013 | Cushing | |
| 2015/0160926 | A1 | 6/2015 | Larson et al. | |
| 2017/0177740 | A1 | 6/2017 | Abaya et al. | |

OTHER PUBLICATIONS

Maro, Salome, Anthony Anjorin, Rebekka Wohlrab and Jan-Philipp Steghöfer. "Traceability maintenance: Factors and guidelines." 2016 31st IEEE/ACM International Conference on Automated Software Engineering (ASE) (2016): 414-425.

* cited by examiner

MANAGING DISCOVERY AND SELECTION OF SERVICE INTERFACE SPECIFICATIONS

SUMMARY

In one aspect, in general a computing system comprises: one or more processors configured to receive a first request for one or more service interface specifications, where the first request includes information about one or more model element interface specifications usable for identifying the one or more service interface specifications, the one or more model element interface specifications are part of or are extracted from one or more executable model elements of an executable graphical model, and the one or more service interface specifications correspond to respective services that include features complying with the one or more model element interface specifications and are associated with information necessary for implementing semantics of the one or more model elements. The one or more processors are also configured to: analyze the information about the one or more model element interface specifications, the analyzing comprising evaluating semantics of the one or more executable model elements within the executable graphical model; identify, based on the analyzing, the one or more service interface specifications; and provide information representing the identified one or more service interface specifications for display for selection of at least one of the identified one or more service interface specifications. The computing system also comprises storage configured to store a selection of at least one of the identified one or more service interface specifications after the selection is made.

In another aspect, in general, a method comprises receiving, by one or more processors, a first request for one or more service interface specifications, where the first request includes information about one or more model element interface specifications usable for identifying the one or more service interface specifications, the one or more model element interface specifications are part of or are extracted from one or more executable model elements of an executable graphical model, and the one or more service interface specifications correspond to respective services that include features complying with the one or more model element interface specifications and are associated with information necessary for implementing semantics of the one or more model elements. The method further comprises analyzing, by the one or more processors, the information about the one or more model element interface specifications, the analyzing comprising evaluating semantics of the one or more executable model elements within the executable graphical model. The method further comprises identifying, by the one or more processors and based on the analyzing, the one or more service interface specifications. The method further comprises providing information representing the identified one or more service interface specifications for display for selection of at least one of the identified one or more service interface specifications. The method further comprises storing a selection of at least one of the identified one or more service interface specifications after the selection is made.

In another aspect, in general, one or more non-transitory computer-readable media, have stored thereon instructions that, when executed by a computing system, cause the computing system to perform operations comprising: receiving, by one or more processors, a first request for one or more service interface specifications, where the first request includes information about one or more model element interface specifications usable for identifying the one or more service interface specifications, the one or more model element interface specifications are part of or are extracted from one or more executable model elements of an executable graphical model, and the one or more service interface specifications correspond to respective services that include features complying with the one or more model element interface specifications and are associated with information necessary for implementing semantics of the one or more model elements; analyzing, by the one or more processors, the information about the one or more model element interface specifications, the analyzing comprising evaluating semantics of the one or more executable model elements within the executable graphical model; identifying, by the one or more processors and based on the analyzing, the one or more service interface specifications; providing information representing the identified one or more service interface specifications for display for selection of at least one of the identified one or more service interface specifications; and storing a selection of at least one of the identified one or more service interface specifications after the selection is made.

Aspects can include one or more of the following features.

The one or more processors are configured to designate a persistent link between the at least one of the identified one or more service interface specifications and the one or more model element interface specifications.

The one or more processors are configured to detect that the persistent link is broken, and to (1) re-establish a persistent link or (2) provide one or more of: information about a location of one or more services associated with the at least one of the identified one or more service interface specifications; or information about recreating the one or more services associated with the at least one of the identified one or more service interface specifications.

Designating a persistent link comprises storing a unique identifier of the at least one of the identified one or more service interface specifications such that one or more services associated with the at least one of the identified one or more service interface specifications is identifiable without using names of the services.

The one or more processors are configured to: provide notifications about changes made to the at least one of the identified one or more service interface specifications or associated services, or changes made to the one or more model element interface specifications, based on the persistent link; provide suggestions on changes to be made to the at least one of the identified one or more service interface specifications or associated services based on changes made to the one or more model element interface specifications; provide suggestions on changes to be made to the one or more model element interface specifications based on changes made to the at least one of the identified one or more service interface specifications or associated services; automatically make changes to the at least one of the identified one or more service interface specifications or associated services based on changes made to the one or more model element interface specifications; or automatically make changes to the one or more model element interface specifications based on changes made to the at least one of the identified one or more service interface specifications or associated services.

Evaluating semantics comprises evaluating a function call prototype, parameters, blocks of the executable graphical model, sub-systems of the executable graphical model, signals of the executable graphical model, or ports of the executable graphical model.

The identified one or more service interface specifications and associated one or more services comprise service syntax that does not match model element syntax of the one or more model element interface specifications, and the one or more processors are configured to convert the service syntax for compatibility with the model element syntax.

The computing system further comprises: a first communication interface providing communication with one or more storage systems storing a plurality of service interface specifications; and a second communication interface providing communication with one or more client computing entities; wherein the one or more processors are configured to manage service discovery between the one or more client computing entities and the one or more storage systems over the first communication interface and the second communication interface, the managing including: receiving requests from the one or more client computing entities, wherein the requests include the first request, sending, to at least one of the one or more client computing entities, the information representing the identified one or more service interface specifications of the plurality of service interface specifications stored in the one or more storage systems, in response to receiving the first request, and receiving selections, from the one or more client computing entities, of selected service interface specifications of the plurality of service interface specifications stored in the one or more storage systems. For example, the information representing the identified one or more service interface specifications may include information resulting from semantic filtering, wherein the one or more service interface specifications have been identified based on evaluated semantics of the one or more executable model elements of the executable graphical model, and/or semantics of the one or more model element interface specifications that are part of or are extracted from the one or more executable model elements.

The managing further includes: maintaining a set of one or more selection records, where each selection record is associated with a client identifier of a particular client computing entity, and sending information to a client computing entity identified by a client identifier associated with a particular selection record of the one or more selection records, the information including an interface identifier associated with the particular selection record.

A first selection record of the set of one or more selection records includes a first storage locator for identifying a storage location in one of the storage systems of a first service interface specification, and the first service interface specification includes the interface identifier that uniquely identifies the first service interface specification among all service interface specifications stored in the one or more storage systems.

The client computing entity identified by the client identifier associated with the first selection record determines whether an association to the first service interface specification requires matching: both the interface identifier and the first storage locator, or the interface identifier and not the first storage locator.

The managing further includes: maintaining within each selection record, a storage locator for identifying a storage location in one of the storage systems that stores a corresponding selected service interface specification; adding a first selection record to the set of one or more selection records, in response to receiving a selection from the first client computing entity of a first service interface specification from among the multiple service interface specifications sent to the first client computing entity; and sending a message to the first client computing entity identified by a client identifier associated with the first selection record, in response to a change in a service interface specification corresponding to the particular selection record, the message including an indication of the change.

A first service interface specification selected by one of the client computing entities has been translated from a first service interface format, and a second service interface specification selected by one of the client computing entities has been translated from a second service interface format different from the first service interface format.

The first and second service interface specifications have both been translated to conform to a predefined canonical format.

Respective services corresponding to the one or more service interface specifications comprise one or more of: a service that performs a function, a service that provides data, a service that provides a data type definition, or a service that provides a value of a parameter for a model element.

DETAILED DESCRIPTION

1 Overview

Figure 1A:
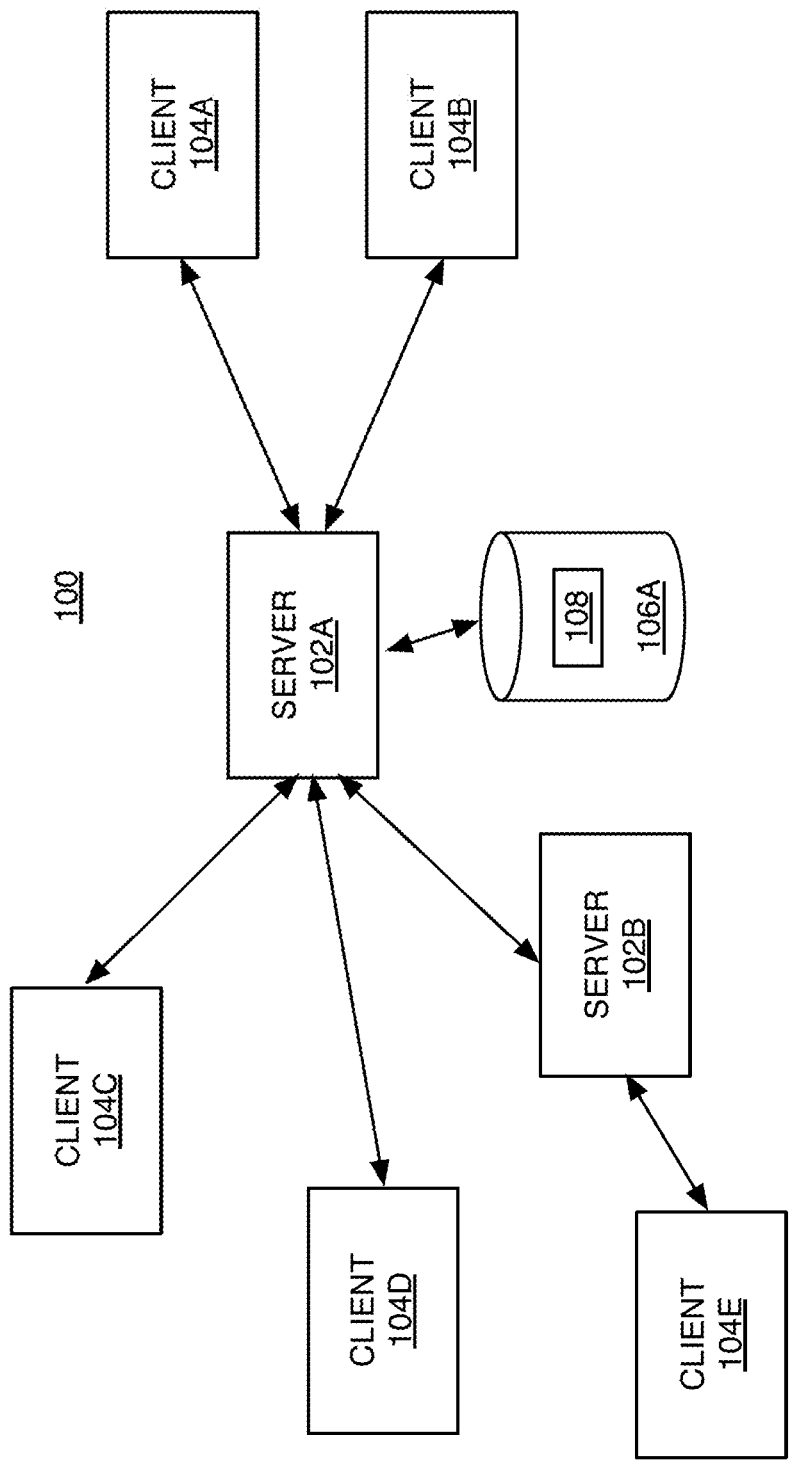
FIGS. 1A and 1B are block diagrams of example computing systems.

FIG. 1A shows an example of a computing system 100 that supports distributed development of various portions of an executable graphical model (EGM) that is developed and executed within a computational modeling system (CMS). For example, the CMS can enable various forms of modeling such as simulating a physical system represented by the EGM, or analyzing certain behavior of that physical system including time-domain and/or frequency domain behavior, and signal characteristics. One form of such modeling that is enabled by the CMS is called Model-Based Design, which can be used for solving problems in various technical fields such as control theory, signal processing, communication systems. The EGM can model physical systems and can be used for design and construction of physical systems, including design of hardware modules of physical systems, and testing and/or generation of code of embedded software modules of physical systems, for example.

An EGM may be graphically represented in any of a variety of graphical forms, depending on the type of modeling being performed. For example, an EGM can be represented as a block diagram, where blocks of the block diagram can represent subsystems or individual components (e.g., circuit elements where the block diagram represents a circuit diagram) interconnected by directed links representing information transfer (e.g., wires carrying signals where the block diagram represents a circuit diagram). In some embodiments, one or more elements of an EGM (called a "model element"), whether being an executable component that behaves using defined component parameters, or a functional unit that performs a defined function, can be developed or provided, e.g., automatically, using a service abstraction.

In some embodiments, a service abstraction enables one entity to define characteristics of an interface of a service being used by a model element of another entity. For example, the service can: perform a function (e.g., a signal processing function such as frequency selective filter, or a control function such as a function for a proportional-integral-derivative (PID) controller, or any function defined by a mathematical formula or programmatic procedure), provide access to a variable (e.g., read and/or write access) such as a variable representing a model parameter, provide a type definition of an abstract data type, or provide data from a data feed, a database, or other data source. An entity that provides a service will be called a "service provider" or simply a "provider" and entity that consumes a service will be called a "service consumer" or simply a "consumer." However, the same entity can be both a provider with respect to one service and a consumer with respect to another service (e.g., a different service). So, the terms "provider" and "consumer" are simply labels used for convenience. In some embodiments, services can also be defined in terms of other services (e.g., a service that performs a function can have a variable used by that function defined in terms of a service that provides a data type definition).

The interface of the service may have characteristics associated with any of a variety of features of a service including input(s) and/or output(s) of the service, a prototype statement for invoking the service, or a data type provided by the service, for example. Such features of a service can be defined to comply with a model element interface specification defined during design of the model element (i.e., at design-time), without requiring the complete implementation of the service being used by that model element to be defined at that time. For example, the implementation of a service can be defined separately and provided to a consumer either at design-time or at a later time (e.g., at compile-time during which the EGM is compiled into executable form, or at runtime during which the EGM is executed). Using the service abstraction, the implementation of the service can be developed independently from the service interface, and the service implementation can be executed later in a manner that conforms to that service interface. In some embodiments, the techniques described herein for managing discovery and selection of a service interface using a broker can also be used to manage discovery and selection of a service implementation. The interface of a model element (specified by a "model element interface specification") may be compatible with the interfaces of a variety of different services (specified by a "service interface specification"). The implementations of each of those different services may implement the model element in different ways but may all provide information necessary for implementing semantics of the model element. Model element interface specifications may be part of, or extracted from, one or more executable model elements of an EGM.

A service interface specification can be stored in a storage system accessible to the computing system 100. The service interface specification specifies the interface for a particular service. Any of a variety of different service implementations can then be associated with the service interface specification, as long as the implementations conform to the service interface specification. Alternatively, some services may not require an implementation since those services may be fully embodied by their respective service interface specifications. An example of this type of service that may not require a corresponding implementation is a type definition service. A service interface specification for a type definition service can be defined, for example, using a typedef keyword (e.g., in the C or C++ programming language) preceding a statement including a concrete data type followed by an abstract data type name (e.g., typedef int8 mytype, which defines an abstract type named "mytype" as an 8-bit integer), without requiring any corresponding implementation. Whereas, a service interface specification for a function may be derived from a design artifact such as a header file (e.g., a ".h" file), and may require a corresponding implementation embodied in a design artifact such as a source file (e.g., a ".c" file). A design artifact can be any file or other data structure that stores any portion of a service interface specification. A service interface specification could be stored in a single design artifact or could be stored in multiple design artifacts. A design artifact does not necessarily contain an implementation of the service corresponding to the service interface specification.

In some embodiments, there may be various design artifacts that together implement the functional behavior of a service. Additionally, as described above, a single service can be defined in terms of one or more other services. So, a particular service interface specification can include information derived from one or more other service interfaces specifications. There may be a hierarchy of services interface specifications that is generated based on a combination of design artifacts. As described in more detail below, those design artifacts can be analyzed in order to translate the format of any native service interface specification (i.e., interface specifications in a native format) into a canonical service interface specification that conforms to a predefined canonical format. In some embodiments, the particular manner in which the service abstraction is used within the CMS enables certain advantageous features such as service discovery, semantic filtering, and service information linking, as described in more detail below.

The arrangement of the computing system 100 facilitates the distributed design, development, access, and/or analysis of EGMs. The computing system 100 includes one or more client computing entities that communicate with one or more server computing entities during development of an EGM. In the example illustrated in FIG. 1, there are multiple server computing entities (also referred to herein as "server entities" or simply "servers"), including server 102A and server 102B, and multiple client computing entities (also referred to herein as "client entities" or simply "clients"), including clients 104A-104E. The multiple client entities enable distributed design, development, access, and/or analysis of an EGM by various users of the different client entities (e.g., different developers, or different teams of developers, or a single developer working on different model elements). As part of the distributed design and development, a user of one client entity can design a first model element (e.g., providing a service) that is used, via the service abstraction, by a second model element (e.g., invoking the service) designed by a user of a different client entity. Each client 104A-104E can be configured to access one or more storage systems that store various design artifacts including service interface specifications for services developed using that client entity and any associated implementations for any services developed using that client entity. Some services used by a model element can be provided by accessing a storage system of an entity that is in communication with the computing system 100 but is not configured as a client within the computing system 100. The storage systems can include volatile and/or non-volatile storage media, such as magnetic media (e.g., hard drives or solid-state drives), dynamic random access memory (DRAM), or arrays or homogeneous or heterogeneous combinations of media. The storage systems can be hosted locally, or over a remote connection (e.g., provided by a cloud computing infrastructure).

Any of a variety of hardware architectures can be used to support the individual server and client computing entities. For example, any particular computing entities (whether a server computing entity or a client computing entity) can be executed on separate computer systems, or executed on separate processors or processor cores of the same computer system, or executed as separate processes on the same processor or processor core. In some embodiments, multiple server entities are implemented by a single managing program that is configured to manage a respective server data structure for each server entity, where each server data structure stores a set of selection records corresponding to different services selected by client entities for use in different model elements, as described in more detail below. Client and server computing entities can be different logical computing entities hosted on the same physical computing entity.

At least one of the server entities is configured to act as a broker that manages service discovery between one or more client entities and one or more storage systems (whether that storage system is managed by a client entity in the computing system 100, or another entity that is in communication with the computing system 100). In this example, the server 102A is configured to manage service discovery for client 104A and client 104B that act as service consumers, using a server data structure 108 stored in a storage system 106A managed by the server 102A. The server 102A receives information identifying various service interface specifications that may be available from various service interface specification sources (or simply "sources"). For example, in some cases the source is a client computing entity that is configured to act as a service provider, and in some cases a source is an entity that is dedicated to defining the service interface specification but is not configured to act as the actual service provider (e.g., a C++ header file). The received information includes storage locators for identifying storage locations of the identified service interface specifications within those sources, as described in more detail below. Some sources may include storage systems coupled to clients 104C-104E that act as service providers, or even storage systems coupled to clients acting as both service consumers and service providers (not shown). Some sources are remotely accessed.

For example, various protocols can be used by a client to access a remote service and its service interface, such as Simple Object Access Protocol (SOAP), and other web services standards, including those adhering to a service-oriented architecture (SOA). Other examples of service technologies that may be used to access a service and/or a service interface include: JavaScript Object Notation (JSON) interfaces, network services that are local running on middleware, interfaces for mounting drives or other storage media, remote procedure calls (RPCs), or remote method invocation (RMI). Various techniques can be used to enable a server to access a source (e.g., to load data when needed) including accessing a local file system, accessing a URL over HTTP, accessing JSON data. Any of these or other techniques can also be accessed through adaptation.

Figure 1B:
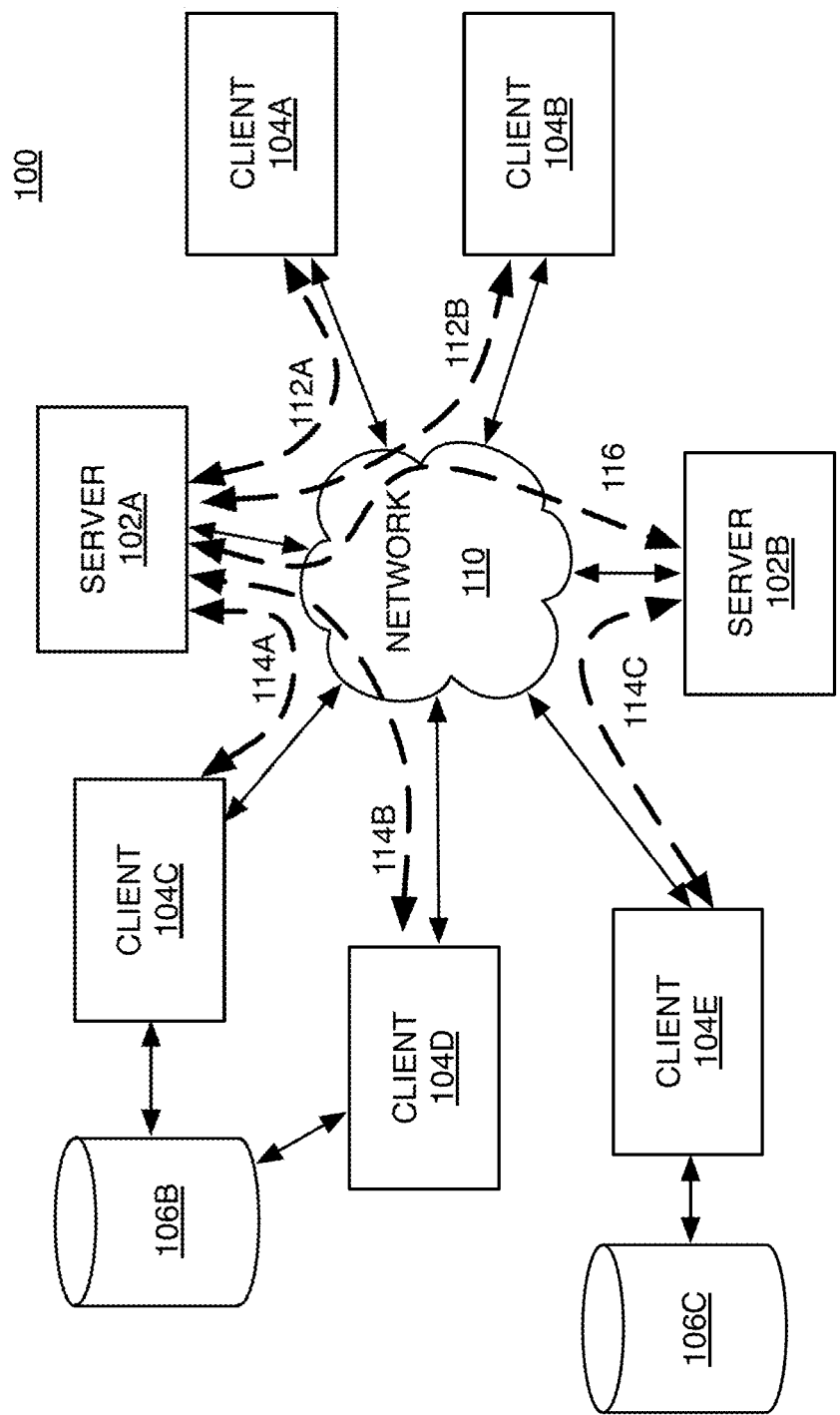

FIG. 1B shows an example of the computing system 100 with communication infrastructure that enables communication between client and server entities. In this example, a network 110 supports service discovery connections 112A-112B between the server 102A and respective clients 104A-104B. Service discovery connections are used to send service discovery requests and receive information for selecting services to link to a model element of an EGM, or other element developed at a client entity, such as an element developed within a modeling environment or technical computing environment (e.g., using a technical computing language). The network 110 also supports service interface connections 114A-114C between the servers 102A-102B and respective storage systems of client entities configured as service providers, including storage systems 106B-106C of clients 104C-104E, and remote storage systems (not shown). Service interface connections are used to support the links to various information about services that have been established, or are potentially available to be established, using the service discovery (called service information linking), as described in more detail below. In this example, the second server 102B acts in conjunction with the first server 102A as a relay to enable links to services using service interface connections 114A-114C and a server connection 116 between the servers 102A-102B. In other examples, a variety of interconnections among different server entities can be used to provide service discovery and linking for various client entities.

In some embodiments, maintaining a service information link, also called a service link, can avoid the need for multiple client entities to each store separate copies of an implementation of a service. Separately stored copies of a service implementation might go out of synchronization with each other and/or might become outdated if there are changes at a source of that service implementation. Instead, each client entity can have a persistent link between a model element and a service interface specification that corresponds to a particular service implementation, which is sufficient for use at design-time. The client entities can be notified of any changes to that service interface specification, but any changes to the implementation, will be automatically incorporated at a later time (e.g., at compile-time or runtime).

The network 110 can be implemented using any of a variety of types of communication infrastructure. For example, the network 110 can support connections within a single device, where the network 110 represents a logical network among processes executing on that device. Alternatively, the network 110 can support connections among multiple devices, where the network 110 represents a physical network among devices connected to wired or wireless communication media. For logical networks among processes, the connections can be made using inter-process communication or message passing, for example. For physical networks among devices, the connections can be made through a network interface that is connected to a local area network (LAN) or wide-area network (WAN), for example, including communication over the Internet.

2 Exemplary Interactions

Figure 2:
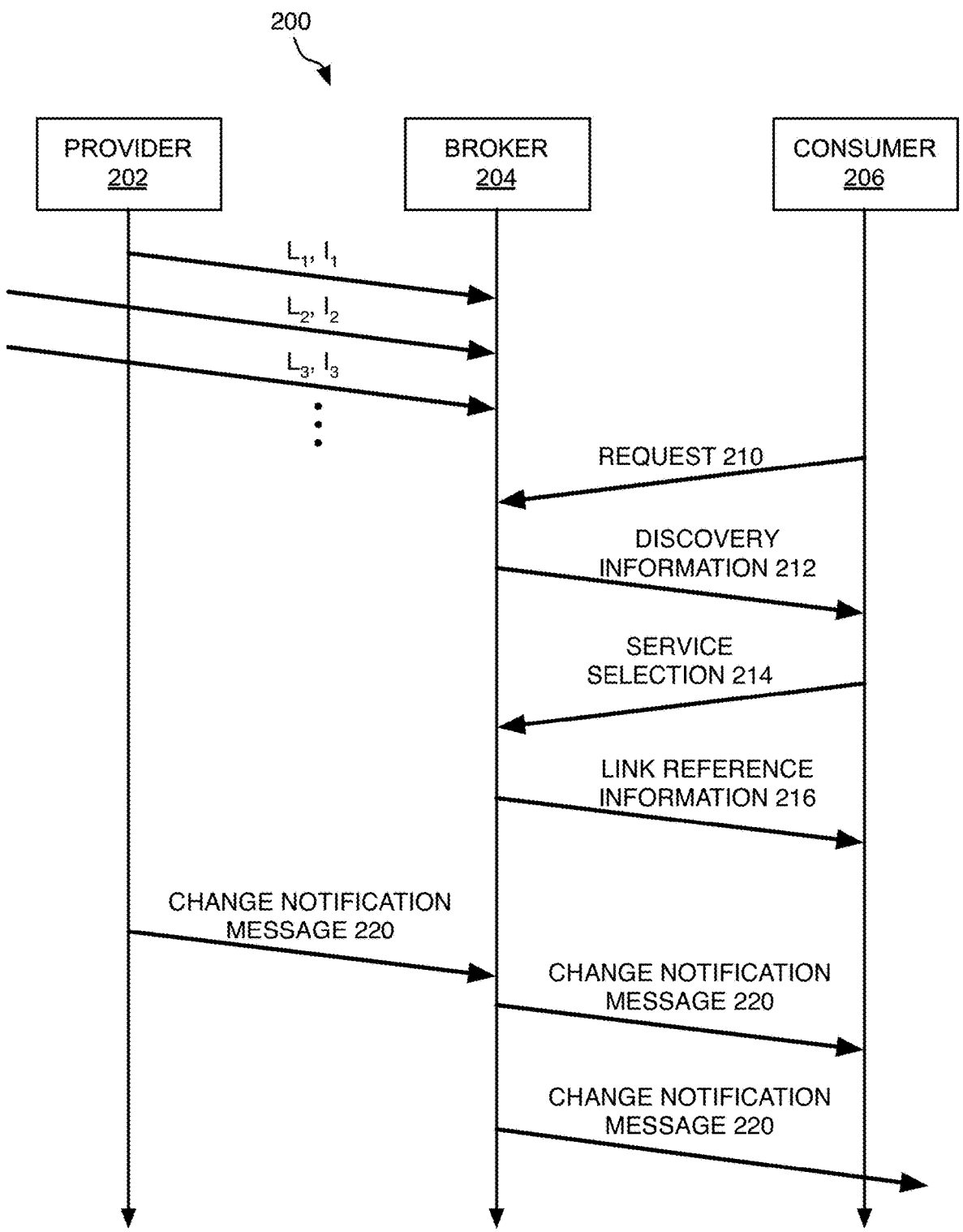
FIG. 2 is an example communication diagram.

FIG. 2 shows an example of a communication pattern 200 representing different interactions between a client entity acting as a service provider (labeled provider 202 in FIG. 2), a server entity acting as a broker (labeled broker 204 in FIG. 2), and a client entity acting as a service consumer (labeled consumer 206 in FIG. 2). The consumer 206 may have selected the broker 204 from among multiple brokers for the purpose of service discovery and service information linking. In the communication diagram of FIG. 2, the arrows between any two of these entities represent communication from one entity to another (e.g., in the form of messages), with time advancing from the top of the diagram to the bottom of the diagram, as indicated by the vertical arrows. Other examples may leave out one or more of the processing phases associated with the communication pattern 200, and/or may perform certain phases, or steps within the phases, in a different order.

2.1 Setup

In a setup phase, potential providers of services can send information registering the existence of those services to the broker 204, in response to a query from the broker 204. For example, a service interface specification for a service $S_1$ is stored at a location accessible to the broker 204 using a storage locator $L_1$ (e.g., a Uniform Resource Identifier (URI), a Uniform Resource Locator (URL), a distributed file system (DFS) path, a server message block (SMB) path, or references to locations within databases) referencing that location in a storage system associated with the provider 202. That service interface specification may exist before any actual implementation of the service $S_1$ has been developed at the provider 202. The service interface specification defines all of the characteristics of that service $S_1$ that are necessary for referencing the service $S_1$ within a model element of an EGM being developed at the consumer 206. Some of those characteristics can include the name and type of the service, e.g., a function name "canio," names and types of any input arguments or output arguments of the service, e.g., an input variable name "x" as an input argument and an output variable name "y" as an output argument, and other information, e.g., data type definitions, associated with an intended context in which the service $S_1$ is to be used. A provider may register selected services that do not necessarily include all services potentially available from that provider or may register selected versions of certain services. In some embodiments, the providers of services do not need to actively respond to queries from the broker 204, but can passively respond, since the broker 204 may be configured to pull information directly from a provider 202, without requiring the provider to specifically identify the broker 204 that made the query.

Other information that is included within the service interface specification for the service $S_1$ can include an interface identifier $I_1$ that uniquely identifies the service interface specification $S_1$ among all service interface specifications stored in the storage systems of any potential provider of services registered with the broker 204. For example, any of a variety of techniques for generating a universally unique identifier (UUID) can be used for generating an interface identifier. The inclusion of an interface identifier within each service interface specification can be used to facilitate service information linking, which can establish a persistent relationship between a particular service consumer and a particular service interface specification to ensure that any given service consumer using a service can be notified in response to certain events (e.g., if the interface for that service is changed).

In the example shown in FIG. 2, the communication pattern 200 includes registration of the service $S_1$ by the transfer of the storage locator $L_1$ and interface identifier $I_1$ from the provider 202, and the registration of service interface specifications for other services $S_2$, $S_3$, . . . by the transfer of their respective storage locators $L_2$, $L_3$, . . . and interface identifiers $I_2$, $I_3$, . . . from other service providers (not shown). Alternatively, in some embodiments, transfer of the storage locator is optional, and transfer of the interface identifier is sufficient for both locating and uniquely identifying a given service interface specification. A search of all the stored service interface specifications stored in a given storage system of a given provider can be performed by an adapter that is in communication with that provider, and the interface identifier can be used to find a match. Additionally, the interface identifiers can be communicated to the broker 204 and can be used later by the broker 204 to fetch the corresponding service interface specification. The interface identifiers can also be used to notify the broker 204 about changes to the corresponding service interface specification, as described in more detail below.

A variety of alternative embodiments can be used. In some embodiments, transfer of the interface identifier is delayed until a later phase (e.g., the discovery phase described below), and registration of the service $S_1$ is accomplished by the broker 204 receiving storage locators or other information used to communicate with the provider 202 in response to future requests (for translation and/or discovery). In some embodiments, the broker 204 is pre-configured to store file paths or other information locating design artifacts from which service interface specifications can be generated in a later phase (e.g., the translation phase described below). The setup phase can also include registration of adapters (described in more detail below) with the broker 204, so that the broker has sufficient information necessary to communicate with each adapter. Information such as the interface identifiers can then be obtained after an appropriate adapter is found for translating a given design artifact into a canonical service interface specification, as described in more detail below. Optionally, the setup phase may include the broker 204 gathering information about what kinds of services each provider is able to provide (e.g., functions, variable access, and type definitions).

A variety of types of services can be registered with the broker 204. The type of a service can be a function that can optionally be applied to one or more input arguments and can optionally return one or more output arguments. The function can perform a procedure (i.e., the procedure defined by a corresponding implementation). The implementation may also be stored in the same storage system that stores the registered service interface specification or may be stored in a different location. In some cases, the function may be associated with a data set such as a lookup table for a lookup function, or the function may be configured to retrieve stored data from a data set. The service may provide a value, such as a value of a parameter for a model element of an EGM. The type of a service can be defined by a standard, such as a service provided by a service-oriented architecture.

This approach also allows described "getter" and "setter" services to expose the internal behavior of an element within an EGM representing a functional block. For example, a Unit Delay block may contain a state value that represents the velocity of a modeled object. It may be desirable to transfer that state value to other EGMs for a number of reasons including state-replication, state-snapshot, recording, and logging. Another usage may be to not only observe the state value, but also to change the state value in response to certain events. State values can be exposed through a getter service and a setter service, which can be implemented as functions that access some or all state values. In addition to state values, getter and setter service interfaces may be defined for other internal data within an EGM, such as functional block parameters and signal values that may represent modes. A "mode" can be, for example, a globally consistent signal value that represents one of the states of either the overall application containing the EGM, associated software (e.g., power-up-mode, run-mode, powerdown-mode), or module level functionality. These modes may be modeled by states in a state transition diagram such as supported by Stateflow.

2.2 Translation

In an optional translation phase, a service interface specification in a native format of a particular provider, or other source of service interface specifications (e.g., a format compatible with a service syntax), is translated into predefined canonical format of a canonical service interface specification (e.g., a format compatible with a model element syntax). Some sources may generate service interface specifications already in the canonical format, in which case translation of those service interface specifications is not necessary. But, when the native format of a provider, or other source of service interface specifications, differs from the canonical format, then translation can be performed. Alternatively, some forms of translation do not necessarily require the existence of a predefined canonical format. For example, a service interface specification can be translated to match a format of another service (e.g., a different version of the same service, or a different service).

To facilitate translation, one or more adapters can be used to translate a different native format (or set of native formats). An adapter that is configured to translate a native service interface specification can analyze a design artifact representing that native service interface specification and extract information that is included in the canonical format. In an example, the native service interface specification is stored in a spreadsheet file, and an adaptor may analyze different rows of that spreadsheet corresponding to different functions, with different columns storing names of different input and output arguments of a given function. As a result of the analysis the adapter generates a service interface specification in a canonical format for each function that includes names of the input and output arguments.

Some brokers may be configured to combine information from multiple adapters, where the information from a particular adapter may have been translated from a native format of a type of design artifact that is readable by that particular adapter. By combining the information received from the different adapters, the broker 204 is able to generate a canonical service interface specification for a service derived from various types of design artifacts. For example, after obtaining a name of an argument from the spreadsheet file, the adapter may access an XML file associated with the spreadsheet to determine that an argument with a particular name has a particular data type. The canonical format can specify certain predetermined information that is necessary for a given type of service, as determined by the CMS. For example, a canonical format for a function may define input and output arguments, their data types, and whether each input argument is required or optional. The particular storage scheme for the canonical format can be defined by the CMS. For example, the service interface specification in the canonical format could be stored in an un-serialized data structure (e.g., an in-memory data structure), or a serialized file (e.g., according to an XML file format, or a JSON file format).

These adapters can be executed directly by a source of the service interface specification, including the provider 202, or by a server entity receiving information from a source of the service interface specification, including the broker 204. Alternatively, in some embodiments, there are separate intermediate adapters that have been registered between a source of the service interface specification and a server entity such as the broker 204. Such intermediate adapters can be registered with the broker 204 to perform translation in response to requests form the broker 204. For example, when the computing system 100 starts up, an adapter registration procedure can be triggered, in which each adapter is registered with the broker 204. Each adapter can be configured to perform translation in response to a request from the broker 204 (e.g., during service discovery, described in more detail below), or may be configured to perform translation before receiving any requests from the broker 204 (e.g., by crawling storage systems storing design artifacts that contain native service interface specifications). One way the broker 204 can initiate translation is by sequentially polling registered adapters (including intermediate adapters or adapters built-in to the broker 204), to determine which adapter is able to translate a particular native service interface specification. Alternatively, the broker 204 can select an adapter for translating a native service interface specification stored in a particular design artifact based on a predetermined characteristic (e.g., a file extension) of the design artifact.

The translated canonical service interface specification can be stored in the storage system of the source along with, or in place of, the original native service interface specification, or the design artifact(s) from which the native service interface specification was derived. The broker 204 can access these canonical service interface specifications for registered services and can use the canonical service interface specifications to present consistent and uniform descriptions of registered services to client entities, as described in more detail below. Copies of the canonical service interface specifications can optionally be cached in storage accessible to the broker 204 (e.g., locally accessible storage and/or storage with faster access), but the broker 204 does not necessarily need to store or maintain all of the canonical service interface specifications, since the broker 204 can use storage locators and/or interface identifiers to access the canonical service interface specifications from the sources. Translation can also be performed on-demand and does not necessarily require persistent and/or non-volatile storage of the translated canonical service interface specification. For example, as mentioned above, an adapter can perform translation during service discovery, in response to a request from the broker 204.

The uniform descriptions of registered services are useful for client entities, such as the consumer 206, because the services can be efficiently accessed by the consumer 206 using the information in the canonical service interface specification without the need for the consumer 206 to perform any management tasks (translation and caching of the service interface specifications) that are handled by the broker 204. In other words, the canonical format can be configured to include sufficient information for accessing a service (e.g., service name, argument names, data types, or any of the other attributes listed below from the example of FIG. 4A), but to exclude certain excess information in the native format that might require unnecessary management overhead (e.g., information that is not utilized within the CMS, including historical information such as date of modification, or links to related information such as requirement specifications). However, if a native format includes less information that is required by the CMS, the adapter can augment any missing information using default information supplied by the broker 204, supplied by the consumer 206, or supplied by a different entity.

Figure 4A:
FIG. 4A is an example of a canonical service interface specification.

Examples of native formats of a service interface specification include formats of files, data structures, or other design artifacts that were developed in: technical computing languages (e.g., MATLAB®), databases, spreadsheets (e.g., Excel®), custom code or libraries written in procedural programming languages (e.g., C) or object-oriented programming languages (e.g., C++), or markup languages (e.g., XML). An example of a canonical format of a service interface specification is a file that is native to an environment used as the CMS (e.g., Simulink®). FIG. 4A shows an example of a canonical service interface specification 400 for a Simulink function. In this example of a Simulink function, there are a number of attributes that can be used in finding matching interface specifications of offered services (e.g., Complexity, DeisgnMaximum, DesignMinimum, Dimensions, NumericType, Unit, and Direction). In this example, the canonical format of the specification 400 uses XML as the general file format, but the particular elements included, and their hierarchical relationships, are arranged according to the canonical format. In this example, the interface identifier is stored within starting and ending XML tags as a UUID "4f41369f-f250-47b4-9335-da666a4ab8c8," which is stored as a value of a parameter named "uuid."

2.3 Service Discovery

In a service discovery phase, the communication pattern 200 includes a request 210 from the consumer 206 to the broker 204. The request 210 includes information characterizing an interface for a service that is being requested. For example, a developer who is interacting with a user interface provided by the consumer 206 may be developing a portion of an EGM that includes a function caller block, which is a model element that can be used to call a function that will be applied at runtime to an input having a specified input data type (e.g., a floating point number) to produce an output having a specified output data type (e.g., also a floating point number). The function caller block may be part of a system represented by the EGM. The developer may want to know what functions are available to be linked to the function caller block at design-time, using the service abstraction, while allowing the actual implementation of that function to be provided later (e.g., in a later design-time stage, or at compile-time, or at runtime). The developer may already have an expected behavior in mind before selecting a particular function but may not know the exact name of the function, or other information that would be included in a service interface specification. In this example, the request 210 includes information that indicates that a service is requested that can take a floating point number as an input and apply a particular function to that input that produces a floating point number as an output. The function may, for example, perform a computation that models the behavior of an electrical circuit element when the floating point values are interpreted as an input current and an output current. The broker 204 receives the request 210 from the consumer 206. The broker 204 also receives requests from any other client entities that have connected to the broker 204.

The broker 204 responds to the requests by giving each service consumer a view of available services. The view can be provided over a user interface that is rendered by the consumer 206 based on discovery information 212 that is transmitted by the broker 204 in response to request 210. The discovery information 212 identifies the service interface specification corresponding to each available service in the view. The broker 204 can manage the view using filtering to remove unnecessary information, as described in more detail below, and using view augmentation to provide additional information. For example, the view augmentation may include highlighting differences between similar service interface specifications provided by different service providers. If the services from two different service providers are two different functions having the same name and same arguments, the broker 204 can provide additional information that describes those two different service providers and any information about differences in the functions. For example, a fully qualified unique identifier of a function can be provided by combining a name or other non-unique identifier with other information, such as location. In the following example, a non-unique function identifier is combined with a location of an artifact in which that function appears: file://director/file.slx#Foo. In this example, "file://director/file.slx" is the artifact location and "foo" is the non-unique function identifier. There may be multiple functions with the same identifier "foo", but a unique identifier can be provided by concatenating the location and the non-unique identifier with a separation character, which in this example is "#". Other techniques can be used to provide unique identifiers for distinguishing functions or other types of services. For example, instead of concatenating the location or other uniquely identifying information, the uniquely identifying information can be used to generate different variants of a name (e.g., foo1, foo2, etc.) that can be mapped to the respective uniquely identifying information.

As mentioned above, in some embodiments, the translation may occur on-demand, for example, in response to the request 210 and before providing the discovery information 212.

In some embodiments, the broker 204 (or other server entity) may broadcast available services without necessarily responding to an explicit request from a consumer. For example, available services can be broadcast periodically, or the broadcast of available services can be triggered in response to client entities broadcasting a signal after an online connection has been established, or on power up, or when a network connection is established, or on a user action, etc.

In some embodiments, the broker 204 is configured to enable semantic filtering. The view may represent a subset of fewer than all of the potentially available services. Using semantic filtering, the service interface specifications that are identified in the discovery information 212 can be based at least in part on information in the request 210 about one or more model element interface specifications. The broker 204 can evaluate the semantics of the one or more model element interface specifications as part of analyzing the information in the request 210, as described in more detail below. In some embodiments, the request 210 includes information about a type of service that is necessary for executing a particular model element with a particular model element interface. For example, if the model element interface specification specifies that the model element is a function caller block, then the type of service needed would be a service for calling a function. The broker 204 can filter the discovery information 212 to only identify service interface specifications for services that are applicable to calling a function. For example, services used for other purposes (e.g., accessing variables, or providing data type definitions) may be filtered out.

A large variety of information about a model element and its context can be considered when evaluating the semantics of a model element. For example, the information may include information about the model or the scope in the model where the model element is used (e.g., does it support continuous-time behavior or only discrete-time, is it discrete event, is it dataflow, does it allow concurrency, does it require Moore or Mealy semantics (or, can a service be used on a transition or not, can a service be used during execution of a state or not), does it support variable-step solvers or only fixed-step solvers, does it support zero-crossing detection, does it support global data access, does it support formal verification methods (e.g., model checking, abstract interpretation), does it adhere to certain style guides (and does the service interface/implementation adhere to these), does it support code generation (for Hardware-in-the-Loop, Processor-in-the-Loop, or embedded targets), does it support linearization, does it support control synthesis (e.g., H infinity loop tuning), does it support noncausal (physics) modeling, does it support frequency domain simulation. For the model element, the context may indicate whether it is part of a nonvirtual (e.g., atomic) subsystem hierarchy (including model reference), whether it is part of conditionally executed functionality, whether it is part of a library element. Also, the available data structures may be used to filter the interface specifications. For example, bus objects, 'structs' in C or C++ code, signal objects, and data store objects may be defined. If these definitions are available in the model element context, the discovery may result in service interface specifications that rely on the availability of these definitions (or, if not available, the service provider may also provide these definitions).

Various procedures used for processing a model, such as propagation and inferencing, both described below in more detail in the context of an exemplary modeling environment, can be part of semantic filtering. When a model element that uses a service receives a parameter value (e.g., a sample rate of a signal) based on propagation or inferencing, services that are identified by the discovery information 212 may be semantically filtered based on that received parameter value. For example, services with the same sample rate will be shown while services with different sample rates will be filtered out. Or, services with parameter values that can be reconciled may be shown. They may be shown differently, such as to indicate that reconciliation is required. For example, the base sample rate of a model may be chosen to be a certain value. Services that have a sample rate that is an integer multiple may be shown as being compatible but requiring a reconciliation. Likewise, given a set of sample rate parameter values in the model, a service may be shown if it has a sample rate parameter value that is a harmonic of the existing sample rate parameter values or if the service allows a set of sample rate parameter values that includes an existing sample rate parameter value or a harmonic sample rate parameter value. All of this may also apply to data types as well. A data type may be reconciled if, for example, a conversion is possible without loss of precision (e.g., from single to double or from integer to double). Alternatively, a loss of precision may be allowed, and so reconciliation from double to single or from double to integer may also allow services that require such reconciliation to be shown (again, possibly indicated to the user that a reconciliation is necessary and whether there is a loss of precision). In some situations, only services with incompatible parameter values are available. The system may offer a conversion to convert the available services for compatible use. A sample rate conversion can use a rate transition operation.

To implement semantic filtering, in some examples, the broker 204 can analyze information in the request 210 to evaluate semantics of a model element (e.g., characteristics of the model element itself and characteristics of the context of that model element within an EGM) for which the request 210 was triggered by the consumer 206 (e.g., in response to a developer interaction with the user interface of the consumer 206). In some embodiments, the consumer 206 can also send additional requests or other information based on input from a user after the initial request 210 to reflect changes in context as the user develops an EGM at the consumer 206. Alternatively, the consumer 206 can send additional requests or other information based on other events that do not necessarily require user input (e.g., as one model element resolves, another model element may be resolved with additional information now available). This dynamically changing context can be used by the broker 204 to dynamically update the results of the semantic filtering, or to update other parameters that determine the scope of the service discovery.

The semantic filtering can ensure that each of the service interface specifications identified in the discovery information 212 is relevant to the request 210. For example, the number of required input arguments, number of required output arguments, data type of input arguments, and/or data type of output arguments, the sample time (or sample rate), whether a call of a service is event based or time based, or whether a service is synchronous or asynchronous can all be indicated by the consumer 206 in the request 210 to ensure that only service interface specifications that are relevant are identified by the discovery information 212. Relevance may in some cases correspond to exact matches in numbers of required and optional input and output arguments or may in other cases correspond to ensuring only numbers of required input and output arguments are met. For example, if a request requires X input arguments to a function, and a service interface specification for a function specifies Y required input arguments and Z optional input arguments where $Y+Z \geq X$, the service may still be considered relevant even if $Y<X$. Information within the request 210 characterizing features of the EGM modeling a subsystem and/or features of the EGM modeling a larger system can also be used to filter the service interface specifications identified in the discovery information 212.

The relevance of a service interface specification may be structural, as described in the previous paragraphs, but may also be described in terms of metadata associated with the services. For example, if a request requires the function "canio" and additionally labels that request with Quality-of-Service attributes including the resolution of sensory data (quantization) or the timing of sensory data (latency), multiple providers may be able to provide a canio service that meets these Quality-of-Service attributes. In this case, the broker 204 can match the best service description based on metadata associated with the request and based on metadata associated with the provided service interface specification.

The broker 204 can also be configured in other ways to manage scope of the search that is performed in the service discovery phase. For example, for each entity in communication with the broker 204 as a service provider, each of the service interface specifications that have been made accessible to the broker 204 (e.g., via an adapter) can be set as discoverable or not discoverable to be selectively exposed to service consumers in general, or to specific service consumers.

A requested service may be described explicitly, for example, using plain text such as "y=canio(u)" to describe a requested canio service function, or a requested service may be implicitly deduced from one or more model elements in the EGM. For example, a function caller block may describe the interface (e.g., "y=canio(u)") of the function that the block would call. In this case, a required service may be defined as a described function interface. This process may be referred to as delegation. The term "delegation" is appropriate because the function caller block is presumed to call a named function that is visible—by scoping rules—to that caller block. To satisfy this rule, the modeling environment may define a service interface and designate it as a delegate function that meets the scoping and visibility rules of that caller block.

Similarly, a provided service interface may be described implicitly by model elements in the model. For example, a function caller block that describes a function "y=canio(u)" may be associated with a service interface specification. In this case, a provided service may be defined by deriving a description of that service from the description of the function caller block. For example, when a function to be called does not exist, a developer of a function caller block can provide a description of a desired function having a desired functionality. In some cases, for distributed system or software development, one developer managing one part of the system or software may need a function with certain functionality, but the actual implementation or code for a function providing that functionality may not be developed yet. The developer can indicate the desired function first without interrupting their own workflow, and another developer can develop another part of the system or software providing implementation or code for that function via the broker 204.

In some embodiments, the broker 204 is also able to generate new services and/or synthesize services that are composed of one or more existing services, which may include construction of identifiers that can be referenced by consumers.

2.4 Service Selection and Linking

In a service selection and linking phase, the broker 204 receives from the consumer 206 a service selection 214 of a particular service interface specification to be linked with the model element for which the request 210 was sent by the consumer 206. The server data structure 108 stores a set of selection records corresponding to different services selected by various client entities acting as service consumers, including the consumer 206. A selection record establishes a link, e.g., a persistent link, between a model element in an EGM of a client entity in the CMS and a corresponding service interface specification stored in a storage system of a service provider (e.g., a different client entity in the CMS). The server data structure 108 can be, for example, an XML file with selection records stored as different elements within the XML file.

Figure 3:
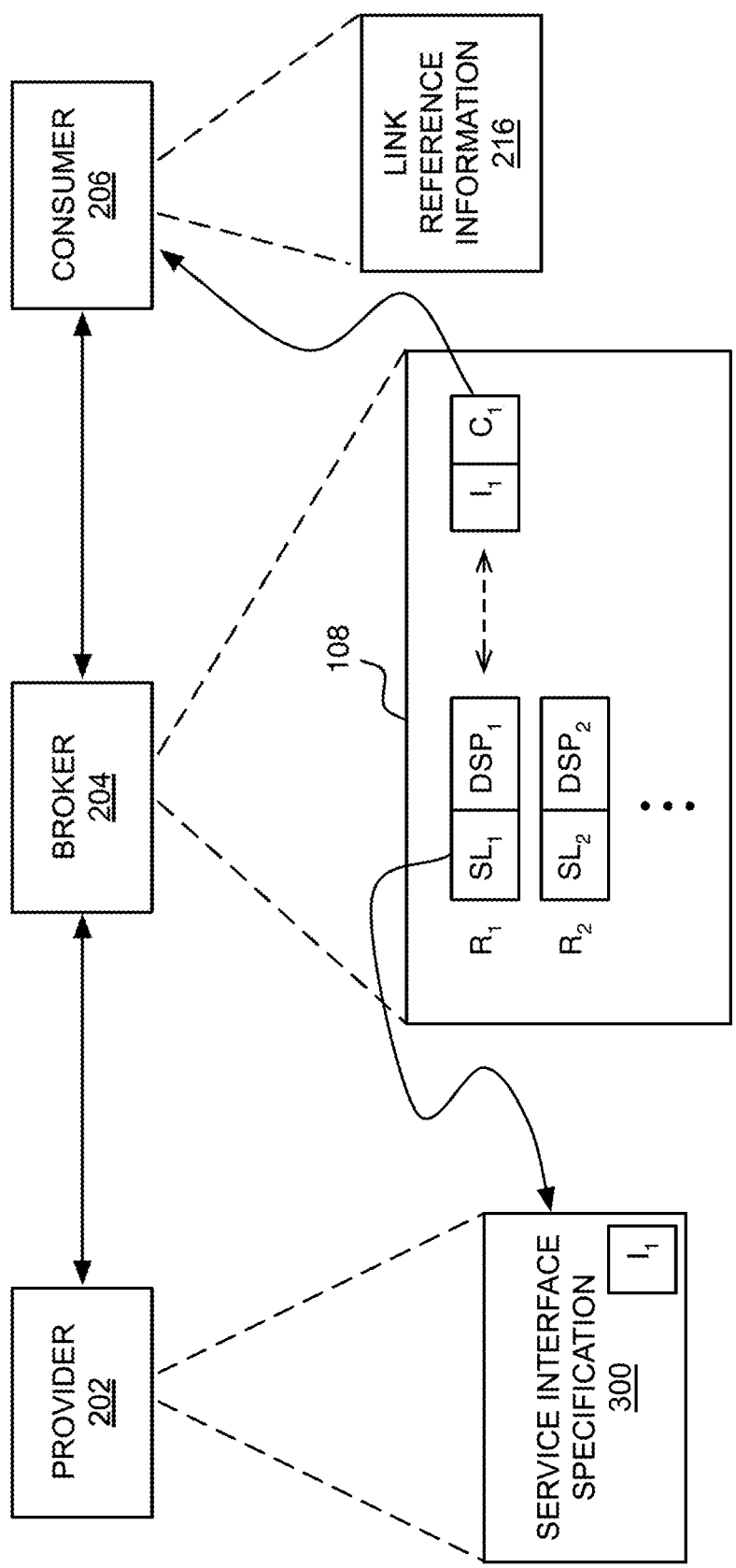
FIG. 3 is a schematic diagram of an example server data structure for service information linking.
Figure 4B:
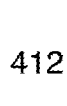
FIG. 4B is an example of a selection record.

For example, referring to FIG. 3, a selection record $R_1$ added to the server data structure 108 in response to the service selection 214 selecting the service interface specification for the service $S_1$ includes the following two fields: the storage locator $SL_1$, and a data structure path $DSP_1$. The storage locator $SL_1$ is in some cases an exact copy of the same storage locator $L_1$ that was received from the provider 202 (e.g., the same URI), or in some cases is not an exact copy but is an equivalent storage locator that is still able to locate the service interface specification 300 for the service $S_1$ stored in the storage system of the provider 202. The broker 204 is also able to use the $SL_1$ to identify the provider 202 and its storage system, for example, using a URI resolution protocol. The data structure path $DSP_1$ stores a path within a storage system of the broker 204 of the server data structure 108. This data structure path field can be optional. The data structure path field provides the ability to detect when a given server data structure has been moved or copied within a file system hierarchy (e.g., nested directories or folders). For example, if a data structure filesystem path no longer matches the stored data structure filesystem path of the server data structure 108, the broker 204 can either preserve or break the service links represented by the selection records stored in the server data structure, based on received input or based on default rules. A service link can be preserved, for example, if the storage locator $SL_1$ still resolves to the service interface specification with the same interface identifier $I_1$. In some embodiments, the data structure path is not stored within each selection record, but is stored in the server data structure 108, which may be sufficient for associating each record within the server data structure 108 with the data structure path. FIG. 4B shows an example of a server data structure 410 that includes a selection record 412, and a data structure path "/local/qshi/bash_18a/slfunc/mydict.sldd". The selection record 412 includes a storage locator "file://local/qshi/bash_18a/slfunc/P1.slx".

In some embodiments, other information is also stored in the storage system of the broker 204 when the selection record $R_1$ is added to the server data structure 108. Stored within the selection record $R_1$, or otherwise stored in association with the selection record $R_1$, can be the interface identifier $I_1$ that corresponds to the selected service interface specification for the service $S_1$. Also stored in association with the selection record $R_1$, can be a client identifier $C_1$ that identifies the particular client entity that sent the service selection 214, which in this example is the consumer 206. Optionally, additional information can also be stored within, or associated with, the selection record $R_1$. For example, information identifying the provider 202, whose storage system stores the service interface specification located by the storage locator $SL_1$, can be stored. Also, a brief description of the service $S_1$ can be stored. For a service that calls a function, for example, a prototype statement for calling the function can be included using the name of the function, and generic or default names for its arguments and/or a type signature for its arguments (e.g., the prototype statement: output_argument=function_name(input_argument)).

Some of the information in the selection record $R_1$, or associated with the selection record $R_1$, can be stored in a storage medium that has relatively faster access speeds than other storage media. For example, the storage locator $SL_1$ can be stored within the selection record $R_1$ in a relatively persistent storage medium (e.g., a non-volatile storage medium, such as hard drive or solid state drive). But, the interface identifier $I_1$, the client identifier $C_1$, the information identifying the provider 202, and the description of the service $S_1$ can be stored in a different data structure, having a one-to-one correspondence to the selection record $R_1$, but stored in a storage medium that has faster access speeds even if that storage medium is less persistent (e.g., a volatile storage medium, such as a DRAM module of a main memory). In the event that the information stored in the less-persistent storage medium is lost, it can be restored by communication between the broker 204 and the provider 202 using the persistently stored storage locator $SL_1$.

Figure 4C:
FIG. 4C is an example of link reference information.

Referring to FIGS. 2 and 3, as part of service information linking, the communication pattern 200 may also include transmission of link reference information 216 from the broker 204 to the consumer 206. In some embodiments, the link reference information 216 includes the interface identifier $I_1$ that corresponds to the selected service interface specification for the service $S_1$. Since the interface identifier $I_1$ uniquely identifies the service interface specification, the link reference information 216 does not necessarily require any additional information to complete a service link to the selected service interface specification and its associated implementation stored in the storage system of the provider 202. In some embodiments, the link reference information 216 also includes other information, such as a copy of the storage locator $SL_1$, or a copy of the brief description of the service $S_1$. Such information may not be required to maintain the service link, because as long as the consumer 206 is able to communicate with the broker 204, the interface identifier $I_1$ stored by both the consumer 206 and the broker 204 can be used to match a particular selection record $R_1$ of the broker 204 to particular link reference information 216 of the consumer 206. One reason why it may be useful to mediate communication between the provider 202 and consumer 206 through the broker 204 in this manner is that the computing system 100 may be configured to restrict direct communication in order to allow the broker 204 to control accessibility of services. FIG. 4C shows an example of link reference information 420, which, in this example, includes the same interface identifier "4f41369f-f250-47b4-9335-da666a4ab8c8" stored in the service interface specification 400, and the same storage locator "file://local/qshi/bash_18a/slfunc/P1.slx" stored in the selection record 412.

2.5 Change Notification

The communication pattern 200 can also include change notification messages 220 transmitted from the provider 202 to the broker 204, and from the broker 204 to the consumer 206. Generally, through service information linking, the consumer 206 is able to support continued design of a portion of an EGM that includes the model element that is linked to the service $S_1$ without storing copies of the entire service interface specification and its associated implementation, which can remain at the provider 202. Thus, the CMS is able to avoid the overhead processing that would be necessary to ensure the copies stay synchronized with every update to the implementation as it is being developed at the provider 202. Instead, only certain changes that actually affect how the service is accessed (e.g., certain changes to the service interface specification in its canonical form) can be sent to the consumer 206. The changes to the service interface specification stored at the provider 202 may have been made by a developer interacting with the client computing entity that is configured as the provider 202, for example.

For example, if the provider 202 changes any information in the service interface specification that was delivered to the consumer 206 (e.g., via the broker 204), such as the brief description of the service $S_1$ (e.g., a function name, and names of arguments), any client entities that have linked to the service $S_1$ as a service consumer, including the consumer 206, can be notified of that change through change notification messages 220. Each change notification message 220 can include an indication of the change that was made to a service interface specification, which triggered the change notification message 220. The consumer 206 can then respond to the change notification message 220 accordingly. For example, through a user interface at the consumer 206, a user can provide input to accept a change, or a user can be given an opportunity to select a different service. Alternatively, a change indicated within the change notification message 220 can be automatically applied to link reference information 216 without explicit input from a user. A user may be alerted through the user interface that a change was applied, for example, by highlighting the changed portion.

Since different entities configured as service providers have different capabilities, changes to a stored service interface specification, or design artifacts from which it was derived, can be detected in any of a variety of ways. Some providers, such as client entities within the CMS have the capability to send change notification messages 220 to any server entity, or entities, where they have registered as a service provider (i.e., in a "push" mode). For other providers, a server entity can query the providers (e.g., periodically, at regular or irregular intervals of time) to receive any change notification messages 220 in response to the queries (i.e., in a "pull" mode). The periodic queries may be performed using remote processes (i.e., a process remote from the broker 204) that perform queries at the providers. For example, a crawler process may examine design artifacts within a storage system of a provider to detect changes (e.g., detecting modification times of files).

In response to receiving a change notification message 220, a server entity acting as a broker can send a corresponding change notification message 220 (or simply forwards the received change notification message 220) to every client entity that is identified by a client identifier associated with a selection record that matches that change notification message 220. A match may occur, for example, by comparing an interface identifier within a change notification message 220 to an interface identifier associated with a given selection record. Since multiple client entities may select a particular service interface specification having a unique interface identifier, there may be multiple selection records that link to that same service interface specification. For either the push mode or the pull mode, the client entities that are configured as service consumers are able to receive the change notification messages 220.

2.6 Communication Using a Service Link

A variety of additional communication can occur as part of the communication pattern 200, including communication that uses the established service link. For example, at compile-time or runtime, the consumer 206 may use a service link for a particular model element to send a request to the broker 204 for the most current service implementation corresponding to the uniquely identified service interface specification to be sent. After the service implementation is received along with the unique interface identifier, the consumer 206 can compare the interface identifier with the copy stored in the link reference information 216 to ensure that they match, e.g., identically, to confirm the service link. If the link reference information 216 includes a copy of the storage locator, then the consumer 206 may indicate (when the service link is established) whether a confirmed service link requires matching both the interface identifier and the storage locator, or requires matching just one of the interface identifier or the storage locator. For example, if a particular, uniquely identified, service interface specification is copied to a different service provider after a service link has been established, it may still be appropriate for the service consumer to confirm the link despite the new service provider. But, if the consumer 206 indicates that a confirmed service link requires matching not only the interface identifier, but also the storage locator, then an error can be indicated if a change in service provider is detected.

2.7 Traceability

The service information linking can also enable traceability between a service interface specification and a corresponding implementation for development of an EGM based on the linked services. Allowing a consumer's model element represented by an EGM to link to a required provider's model elements in the manner described herein enables the CMS to prove that the model was built from the correct sub-models. In some cases, the implementation of a service for a model element is not exposed from one client entity to another (e.g., for proprietary reasons). but by linking a model element to the service interface specification of a service, even without receiving any information about the actual implementation of that service at the model element, the model element can still be confirmed as having used a correct implementation. Because the service link can be maintained as the unique identification of a particular service interface specification, this form of traceability between different model elements can be used for more than confirming that a model element used a service with a correct name, for example. This form of traceability can also allow any changed or missing linked items to be identified through the change notification process. In addition to enabling a unique identification of a particular service interface specification for a particular implementation of a service, traceability also enables a verifiable association between the that service interface specification and its corresponding implementation. Such provable association for the model elements is useful in certifying a correct implementation of the entire model.

3 Exemplary User Interface

Figure 5A:
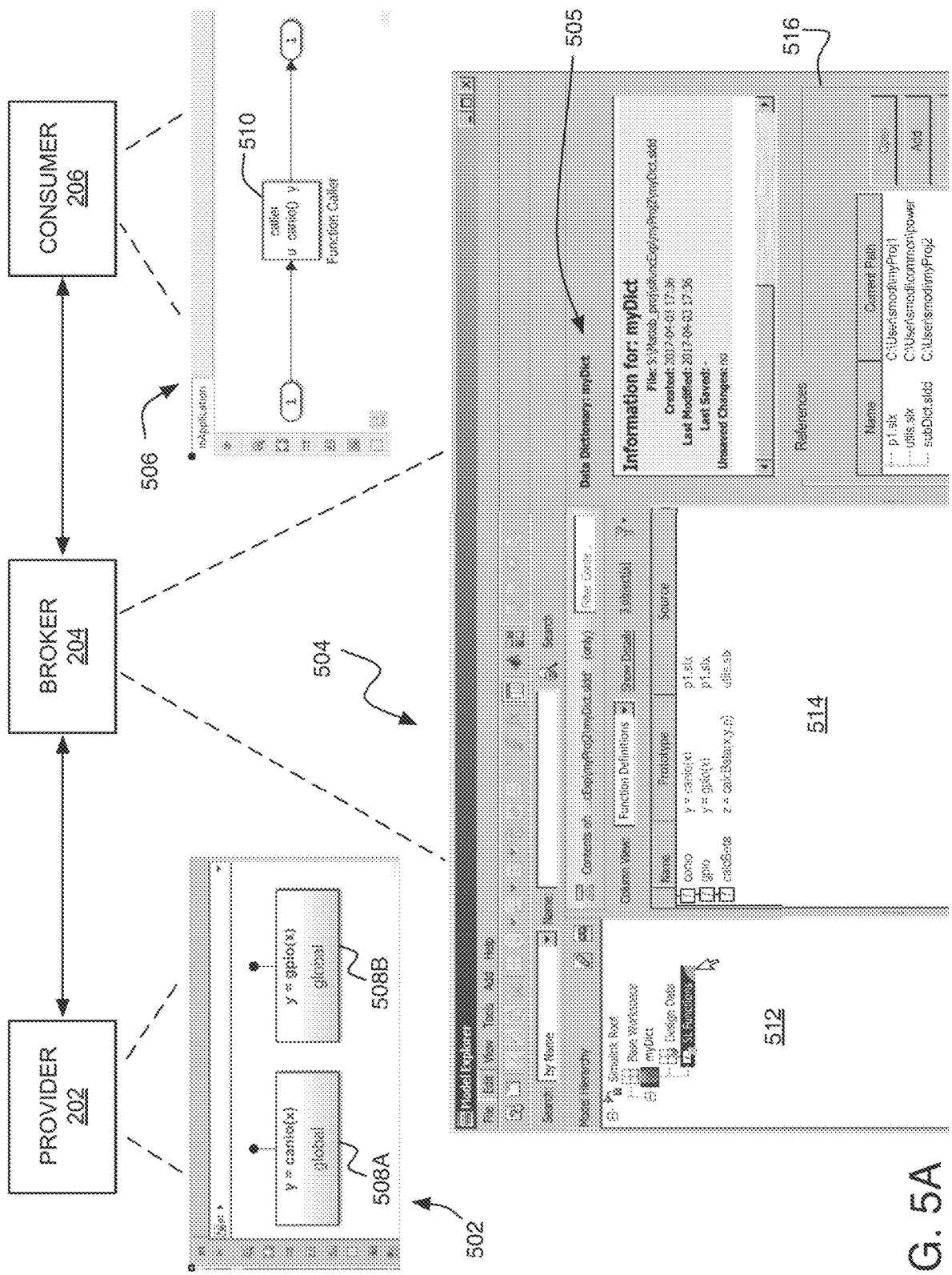
FIGS. 5A-5E are schematic diagrams illustrating example user interfaces.

FIG. 5A shows an example of a user interface 502 for the provider 202, a user interface 504 for the broker 204, and a user interface 506 for the consumer 206. The user interface 502 provides a graphical workspace for developing various model elements, some of which may provide services, such as a model element 508A having a service interface specification that specifies a function including a function prototype y=canio(x), where y represents the output of the function and x represents the input of the function. Another model element 508B having a different service interface specification specifies a function with the prototype statement y=gpio(x). The user interface 506 provides a graphical workspace for developing various model elements, some of which may consume services, such as a Function Caller model element 510 configured to call a function that has been defined according to the linked service interface specification of the model element 508A. The illustrated example shows the function name "canio" within the Function Caller model element 510, which may be accessible for display after the service interface specification of the model element 508A has been selected.

The user interface 504 provides a user the ability to configure the broker 204, and to view information that is managed by the broker 204. This example shows information for a server data structure called "myDict" (as indicated by the label 505) and includes various sections. A model hierarchy section 512 enables selection of various types of model elements that have service interface specifications that have been linked by a selection record, and a view section 514 lists information associated with different selection records. A references section 516 enables management of different design artifacts from different entities configured as service providers. The design artifacts may have been identified by a user of the broker 204, for example.

The user interfaces 502, 504, and 506 may be displayed on separate screens, for example, of different monitors in an embodiment in which the server computing entity hosting the broker and the client computing entities hosting the consumer and provider correspond to separate physical computers. Or, in an embodiment in which the server computing entity and the client computing entities are processes executing on the same computer, the user interfaces 502, 504, and 506 can, be displayed on the same screen. A variety of other combinations are possible, depending on what kind of computing entities are configured as the consumer, broker, and provider.

Figure 5B:
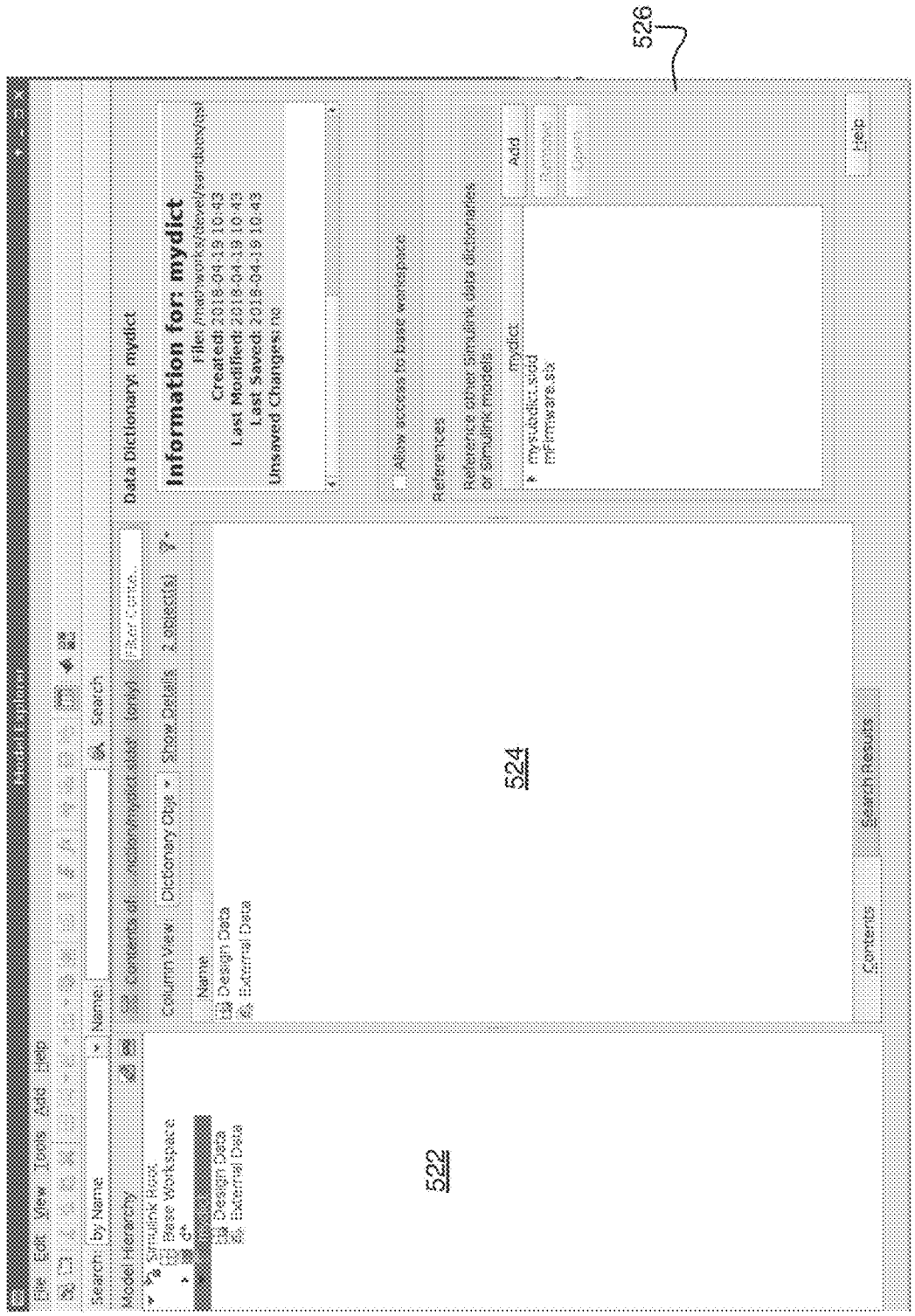
Figure 5C:
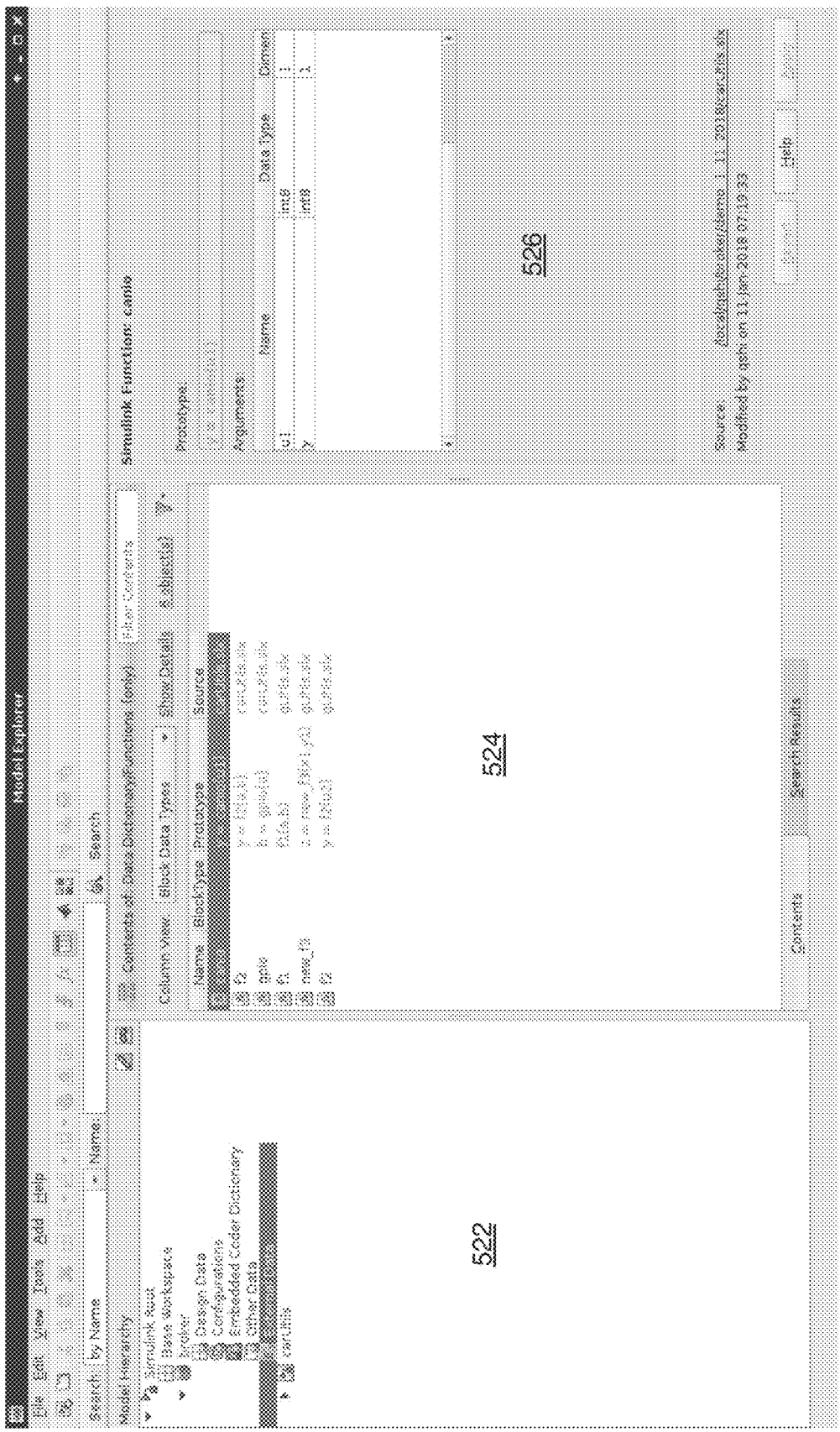
Figure 5D:
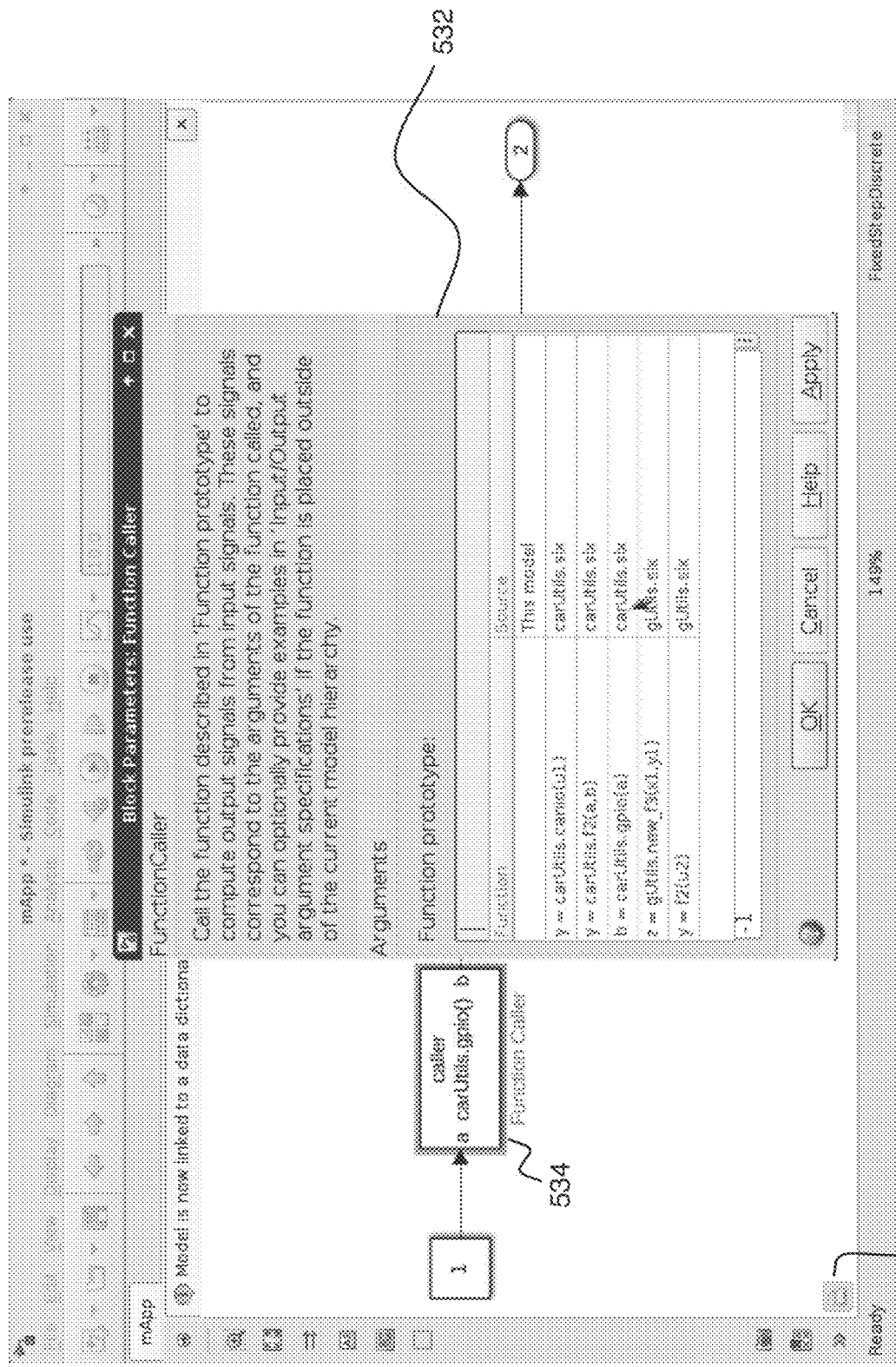
Figure 5E:
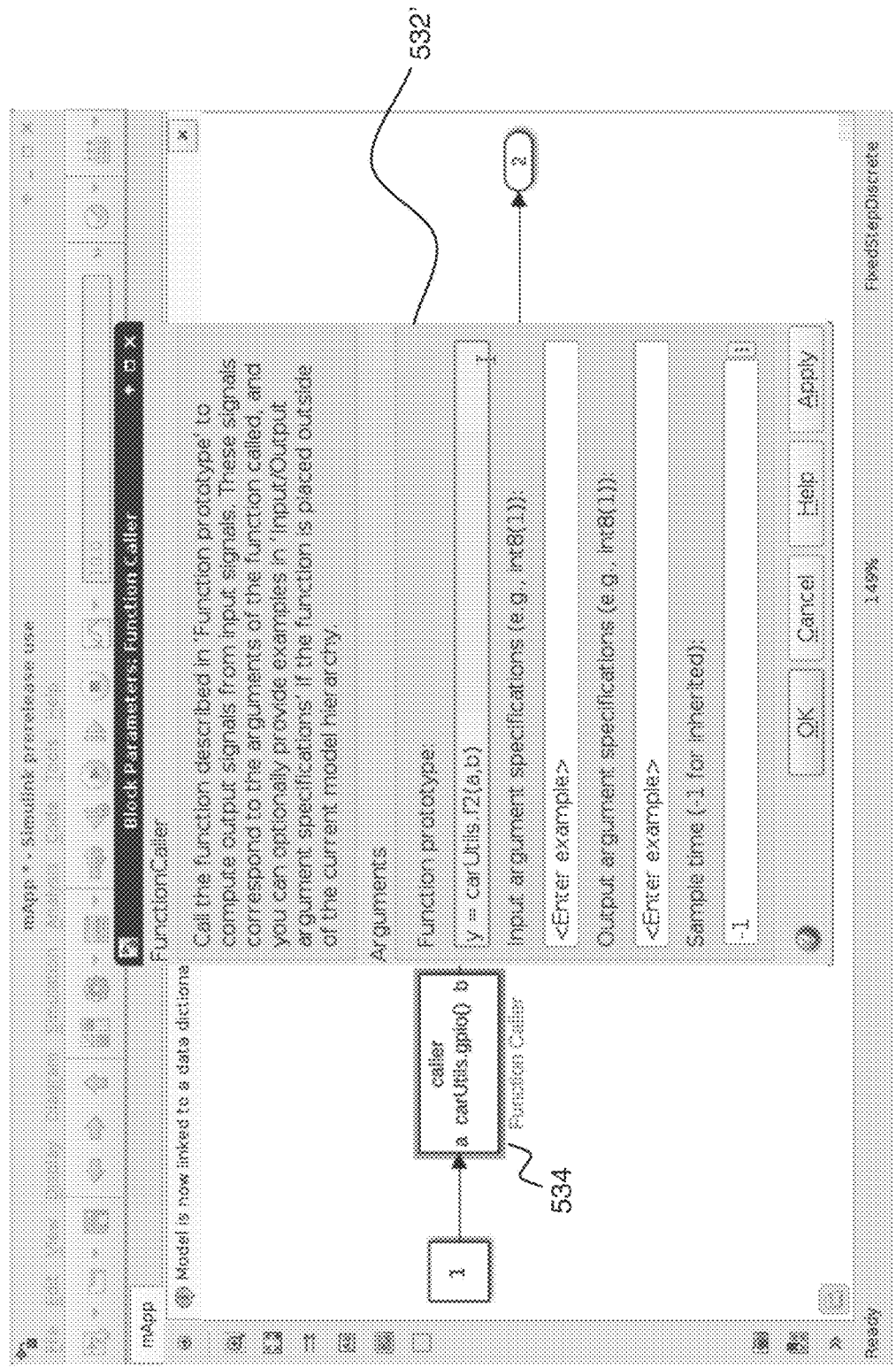

FIGS. 5B and 5C shows another example of a user interface window 520 that may be displayed on a display of the broker 204, and FIGS. 5D and 5E show examples of user interface windows that may be displayed on a display of the consumer 206, enabling a user to select a service based on a selected service interface specification, as described herein. The following description with reference to these figures is an example of possible interactions that one or more users may have, in some embodiments, through user interfaces of the broker 204 or the consumer 206, as a service link is established.

Referring to FIG. 5B, A model hierarchy section 522 enables selection of various types of data structures related to a model, including data structures for a broker. A view section 524 shows particular data structures that are associated with selected data structures in the model hierarchy. The user interface window 520 also includes a number of other information sections that provide information about selected data structures in the model hierarchy. In this example, one of the information sections is a reference section 526 that enables a user to add various types of reference data that can include model data structures associated with models, or server data structures associated with different brokers, also called "data dictionaries".

Referring to FIG. 5C, a user is able to navigate the model hierarchy section 522 to select "External Data" icon under a "broker" icon to show contents within the view section 524 that list functions available within a "Data Dictionary" for a selected broker. The view section 524 shows different functions available for linking, showing name, function prototype, and a source of a design artifact providing that function. An information section 526 displays information about a function that has been selected in the view section 524. In this example, the information displayed includes the prototype and the arguments. For each of the arguments, the name of the argument, the data type of the argument, and the number of dimensions of the argument are shown.

Referring to FIG. 5D, a user interface window 530 displayed for a user of a consumer includes an icon 531 indicating that a link has been established for one or more selected services. A user is able to interact with a model element 534 representing a Function Caller block (e.g., by double clicking on the block) to trigger display of a detail window 532 containing a description of the Function Caller block and parameters including arguments (if any) and a list of available functions along with sources for those functions. For other types of model elements, instead of available functions, a list of other types of available services can be shown to facilitate the service selection and linking described herein. After a function is selected, a service link corresponding to a selection record can be established. If none of the listed available functions is desired, a user is able to type a function prototype within a box of the detail window 532. In some embodiments, more generally, a user can type a (e.g., partial) prototype and the available services can be filtered, and the filtered subset can be shown to the user indicating services available for linking.

After a user types a function prototype, or selects a function prototype from a list, the user can be prompted to establish a service link in any of a variety of ways. For example, an icon or visual marker within the Function Caller block or other location within the user interface window 530 or detail window 532 can be displayed. The user can explicitly respond to such prompting, or in alternative embodiments, a user may not need to explicitly respond. Instead, the system can be configured such that a selection of a function (or other service) automatically establishes a service link. Referring to FIG. 5E, after a function is selected, the detail window 532' is altered to enable the user to provide additional information, such as input argument specifications and output argument specifications, such as data types for the arguments.

The establishment of a service link enables resolution of a variety of model parameters at any of a variety of stages of development of an EGM, including design-time, compile-time, and/or runtime. As described herein, the model parameters being resolved can include functions of a Function Caller block or other available resources. Model parameter resolution can also be performed hierarchically. For example, typically, a Function Caller block can attempt to call a function "foo" at a lowest hierarchical level first, and if an implementation is not available at a particular level a next higher level can be attempted until an implementation is found. Using a service link, a Function Caller block can be configured to call "foo" using an implementation at any particular level that is selected without being required to follow the hierarchy in the typical manner. In this way, use of an implementation at a particular level can be ensured, without the uncertainty of different implementations being used depending on the availability of implementations at different levels.

Some service linking can occur at compile-time. In some embodiments, model elements include links to functions or other services that are "soft links" that are not fully resolved using the techniques described herein, which provide "hard links." In these embodiments, at compile-time, the system can discover sources for resolving the soft links and either: (1) automatically perform service selection to provide hard links, or (2) provide a user a list of model parameters to be resolved to allow the user to choose which soft links to convert into hard links. Compilation can also provide error information. For example, the actual service provided under the same function signature can be different from intended, e.g., when there are multiple versions of functions that have the same function signature. Compilation can detect whether an incorrect version has been implemented and notify the system/user. Additionally, an established hard link can be configured to apply to an entire model, instead of just applying at the block level. A user can choose to hard link all linked services throughout the model to reduce the burden of model parameter resolution.

While some of the example embodiments of the techniques for providing hard links are described for the case of a service that associates a particular function with a Function Caller block, a variety of different types of services providing values or data structures, for example, can be associated with various model elements using hard links. For example, a Gain block can be associated with a service providing a value hard linked to its gain parameter, and a Bus Creator block can be associated with a service providing a struct data structure hard linked to its Bus type parameter. When a parameter associated with a "referencing" model element references another "referenced" model element (such as a Gain block referencing a numeric variable, or a Bus Creator block referencing a Bus type), such reference can be maintained as a hard link by the referencing element storing a unique identifier of a service interface specification for a service providing the referenced model element, as described in detail above. For any of these embodiments, a hard link allows the referenced element to be referred to not merely by its name, thus preventing a different element with the same name from being inadvertently and mistakenly referenced.

A user can provide context information at design-time, or at compile-time in response to prompting. Examples of context that may be provided (e.g., by a user) for discovery include a variety of different types of search criteria, including: service names, service class (e.g., function, data types, parameters), property values or names, etc. A user can use a pull-down search menu or a search icon, for example, to provide search criteria. Another example of context that may be provided (e.g., by a user) for discovery includes information associated with non-causal modeling, as described in U.S. Pat. No. 8,812,276, incorporated herein by reference.

In some embodiments, there are procedures to detect and correct errors associated with hard links. For example, a hard link that has been "broken" may be detectable through information associated with the hard link (e.g., a URI of a particular design artifact associated with the hard link, and/or a unique identifier within that design artifact) and/or a storage locator for a service interface specification for a service providing a referenced model element. The computing system 100 can be configured to provide information (e.g. workspace variables or variables in a data dictionary) to help recreate any missing information and/or re-establish a broken hard link. Additionally, the information characterizing one or more established hard link(s) can be stored and can be used to provide a clear indication whether a broken hard link can be restored (e.g., indicating if a referenced model element is available).

In some embodiments, a user can disable any particular hard link. For example, a user may disable a hard link to allow name-based resolution, or to allow shadowing of one name by another name (so that the shadowing is not considered an error condition). The user can choose to re-enable the disabled hard link at a later time. After the hard link is re-enabled, shadowing again becomes an error condition.

Before compile-time, information available through a hard link can stay associated with a referenced service interface specification, service implementation, or design artifact for a particular service without necessarily being propagated to a model element using that particular service. But, the information may be propagated to the model element at or after compile-time.

4 Exemplary Modeling Environment

Figure 6:
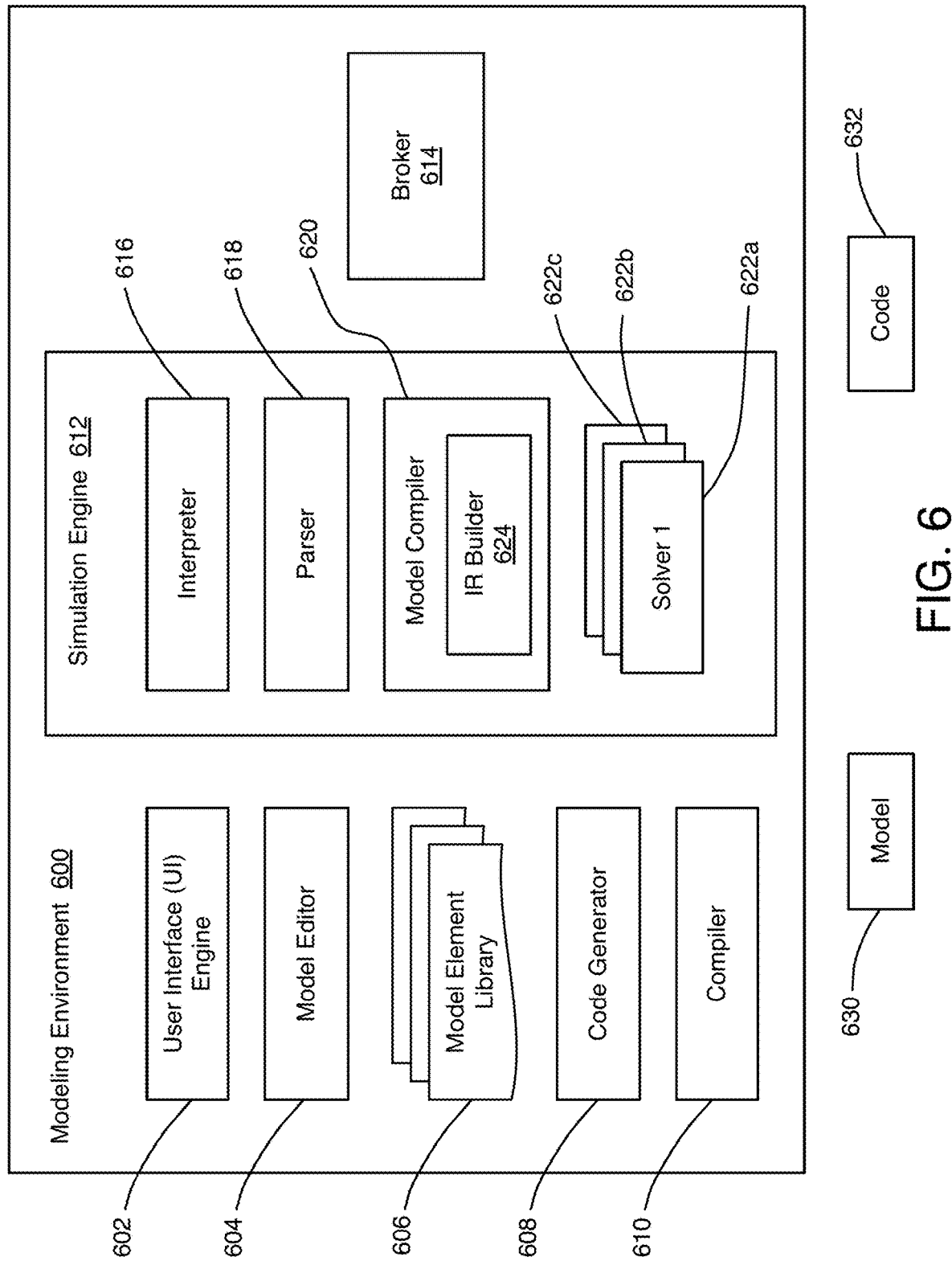
FIG. 6 is a partial, schematic illustration of an example modeling environment.

FIG. 6 shows a partial, schematic illustration of an example of a modeling environment 600 of the CMS. The modeling environment 600 may include a User Interface (UI) engine 602, a model editor 604, one or more model element libraries indicated at 606, a code generator 608, a compiler 610, a simulation engine 612, and a broker 614 (as described above). The UI engine 602 may create and present one or more User Interfaces (UIs), such as Graphical User Interfaces (GUIs) and/or Command Line Interfaces (CLIs), on a display of a data processing device, such as a workstation, laptop, tablet, smartphone, etc. The GUIs and CLIs may provide a user interface to the modeling environment 600, such as a model editing window. The model editor 604 may perform selected operations on a model, such as open, create, edit, and save, in response to the user inputs or programmatically.

The simulation engine 612 may include an interpreter 616, a parser 618, a model compiler 620, and one or more solvers, such as solvers 622a-c. The model compiler 620 may include one or more Intermediate Representation (IR) builders, such as IR builder 624. In some implementations, one or more IR builders may be included or associated with the solvers 622. The simulation engine 612 may execute, e.g., compile and run or interpret, computer-generated, executable models using one or more of the solvers 622a-c. For example, the solvers 622 may generate a set of equations for a model and may solve the set of equations. The solvers 622 may also generate a solution for an in-memory, intermediate representation (IR) of a model that represents a set of computational operations. The solvers 622 may generate the solution for the IR using numerical techniques. Exemplary solvers include one or more fixed-step continuous time solvers, which may utilize numerical integration techniques, and one or more variable-step solvers, which may for example be based on the Runge-Kutta and Dormand-Prince pair. With a fixed-step solver, the step size remains constant throughout simulation of the model. With a variable-step solver, the step size can vary from step to step, for example to meet error tolerances. A non-exhaustive description of suitable solvers may be found in the *Simulink User's Guide* from The MathWorks, Inc. (March 2017 ed.)

The code generator 608 may access a model, such as model 630, and may generate code, such as code 632, for the model 630. In some embodiments, the generated code may be source code, which may be compiled by the compiler 608, and executed by one or more processors outside of the modeling environment 600. The generated code may thus be standalone code relative to the modeling environment 600. Examples of generated code include Ada, Basic, C, C++, C#, CUDA, SystemC, Ada, FORTRAN, assembly code, and Hardware Description Language (HDL) code, such as VHDL, Verilog, or SystemC, among others, which may be used to synthesize a programmable logic device.

The compiler 610 may prepare data structures and evaluate parameters to create and/or initialize one or more data structures used in a compile stage. For each model element, a method may force the model element to evaluate all of its parameters. During the configuration and propagation of model element and port/signal characteristics, the compiled attributes (such as data dimensions, data types, complexity, sample modes, and sample time) of each model element (and/or ports) may be setup on the basis of the corresponding behaviors and the attributes of model elements (and/or ports) that are related to the given model element, e.g., connected through lines that may be directed relations and shown as arrows. Attributes may also be setup based on the context of a model element or a component in a model. For example, a subsystem, which may be a group of model elements hierarchically represented as a single model element, that has a given sample time may have this sample time be set based on the sample time of model elements included in the subsystem (e.g., a unique sample time of all elements in the group or a base sample time such as the greatest common denominator of all sample times of the elements).

The attribute setup may be performed through a process during which model element behaviors "ripple through" the model from one model element to the next following signal or other connectivity, as well as through the hierarchical structure of the model, and may for example follow connectivity in a forward or backward manner. This process is referred to as "propagation." In the case of a model element that has explicitly specified its model element behaviors or the behaviors of its ports, propagation may help ensure that the attributes of the model element are compatible with the attributes of the model elements connected to it or contained by it. If not, an error may be issued. At least some model elements may be implemented to be compatible with a wide range of attributes. Such model elements may adapt their behavior in accordance with the attributes of the model elements connected to them. The exact implementation of the model element may be chosen on the basis of the model in which the model element is located. Included within this step are other aspects such as validating that all rate-transitions yield deterministic results, and that the appropriate rate transition blocks are being used. A portion of a model element, such as an input or output port of a model element or a value for a model element (e.g., the gain value of a Gain block), may have certain attributes (e.g., parameters) associated with it, and that portion of the model element may be linked to a service that provides a parameter value. For example, one model element (e.g., a block) may have multiple services connected with its various ports and the services that are considered applicable and shown to the user may be filtered based on services linked to other ports of a model element, such as a block.

The compilation step also may determine model element connectivity. For example, a model may include one or more virtual blocks that may play no semantic role in the execution of the model. In this step, the virtual blocks may be optimized away, e.g., removed, and the remaining non-virtual model elements may be reconnected to each other appropriately. This compiled version of the model with actual model element connections may be used from this point forward in the execution process. And, any services that are linked to virtual blocks may be resolved and may not be linked to the compiled version anymore.

Exemplary modeling environments include the MAT-LAB® technical computing environment (TCE) and the Simulink® model-based design environment both from The MathWorks, Inc. of Natick, Mass., as well as the Simscape™ physical modeling system, the SimEvent® discrete-event modeling tool, and the Stateflow® state chart tool also from The MathWorks, Inc., the MapleSim physical modeling and simulation tool from Waterloo Maple Inc. of Waterloo, Ontario, Canada, the GTSUITE modeling and simulation environment from Gamma Technologies, LLC of Chicago, Ill., the Ricardo WAVE and WAVE RT modeling and simulation tools of Ricardo Software of Chicago, Ill., a subsidiary of Ricardo plc, the AVL Boost modeling and simulation tool of AVL Gmbh of Graz, Austria, the Lab-VIEW virtual instrument programming system and the NI MatrixX model-based design product both from National Instruments Corp. of Austin, Tex., the Visual Engineering Environment (VEE) product from Keysight Technologies Inc. of Santa Rosa, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, the System Generator system from Xilinx, Inc. of San Jose, Calif., the Rational Rhapsody Design Manager software from IBM Corp. of Somers, N.Y., the Dymola modeling and simulation environment of Dassalt Systems, and the ANSYS embedded software platform including the SCADE suite. Models created in the high-level modeling environment may contain less implementation detail, and thus operate at a higher level than certain programming languages, such as the C, C++, C#, and SystemC programming languages.

A given model may simulate, e.g., approximate the operation of, a system. Exemplary systems include physical systems, such as plants and controllers. A model may be executed in order to simulate the system being modeled, and the execution of a model may also be referred to as simulating the model. Models constructed within the modeling environment 600 may include textual models, graphical models, such as block diagrams, state-based models, discrete-event models, physical models, and combinations thereof. A graphical model may include icons or blocks that represent computations, functions, or operations, and interconnecting lines or arrows among the blocks may represent data, signals, or relationships among those computations, functions, or operations. The icons or blocks, moreover, may be selected by the user from one or more of the libraries or palettes 606 that contain icons or blocks for the blocks supported by the modeling environment 600. A model editor GUI may include a Run button that may be selected by the user. The modeling environment 600 may also be configured to receive a run command entered by the user, e.g., in the GUI or in a Command Line Interface (CLI). In response to the user selecting the Run button or entering the run command, the simulation engine 612 may execute the model, and may present the results of the model's execution to a user. Exemplary graphical models include Simulink models, Simscape physical models, SimEvent models, Stateflow charts, LabVIEW block diagrams, MatrixX models, Scade models, Dymola models, VEE diagrams, and Rational Rhapsody models, among others. Other forms of a source program include Modelica models from the Modelica Association, Uniform Modeling Language (UML) models, and Systems Modeling Language (SysML) models, among others.

The MATLAB® TCE is a math-oriented, textual programming environment for control system design, digital signal processing (DSP) design, system identification, optimization, and machine learning, among other uses. The Simulink® model-based design environment is a modeling tool for modeling, simulating, optimizing, verifying and validating, and testing dynamic and other systems, among other uses. The MATLAB® and Simulink® environments provide a number of high-level features that facilitate algorithm development and exploration, and support model-based design. Exemplary high-level features include dynamic typing, array-based operations, data type inferencing, sample time inferencing, and execution order inferencing, among others. Inferencing may involve, for example, deduction of certain attributes associated with the model from other attributes already associated with the model. There may be a predetermined order in in which function blocks are to be processed for inferencing, which may be used during code generation, for example.

In some embodiments, the modeling environment 600 may implement a declarative language. A declarative language is a language that expresses the logic of a computation without describing its control flow. A declarative language may describe what a program must accomplish in terms of the problem domain, rather than describe how to accomplish it as a sequence of the programming language primitives. In some cases, a declarative language may implement single assignment in which variables are assigned once and only once. Examples of support for declarative languages include the Simulink® model-based design environment, which is a time-based language, the Modelica modeling language, and the LabVIEW graphical programming system, Hardware Description Language (HDL), the Prolog language, and the Haskell language, among others. Behaviors of at least some of the model elements and connection elements of a model may include computational implementations that are implicitly defined by a declarative language. The modeling environment 600 may also support constraint modeling (or graphical constraint programming), for example, as supported by Simulink.

It should be understood that the modeling environment 600 is intended for illustrative purposes and that the present disclosure may be used with other modeling environments. For example, in some implementations, the code generator 608 and/or the compiler 610 may be separate from the modeling environment 600.

One or more of the user interface engine 602, the model editor 604, the code generator 608, the compiler 610, the simulation engine 612, and the broker 614 may be implemented through one or more software modules or libraries containing program instructions that perform the methods described herein. The software modules may be stored in a memory, such as a main memory, a persistent memory and/or a computer readable media, of a workstation, server, or other data processing machine or device, and executed by one or more processors. Other computer readable media may also be used to store and execute these program instructions, such as non-transitory computer readable media, including optical, magnetic, or magneto-optical media. In some embodiments, one or more of the user interface engine 602, the model editor 604, the code generator 608, the compiler 610, the simulation engine 612, and the broker 614 may comprise hardware registers and combinational logic configured and arranged to produce sequential logic circuits. In some embodiments, various combinations of software and hardware, including firmware, may be utilized to implement the described methods.

Suitable code generators for use with the present disclosure include, but are not limited to, the Simulink Coder, the Embedded Coder, and the Simulink HDL Coder products from The MathWorks, Inc. of Natick, Mass., the TargetLink product from dSpace GmbH of Paderborn Germany, and QGen from Adacore. Suitable target language compilers include the xPC Target™ tool from The MathWorks, Inc., and a C language compiler. However, other code generation systems and other compilers may be used.

The headings above are intended to aid with readability of the application, and are not for use in construing aspects of, or determining the breath of, embodiments of the invention described in the specification or claims. It is to be understood that the foregoing description is intended to illustrate and not to limit the scope of the invention, which is defined by the scope of the appended claims. Other embodiments are within the scope of the following claims.

What is claimed is:

1. A computing system comprising:
one or more processors configured to:
receive a first request for one or more service interface specifications, where
the first request includes information about one or more model element interface specifications usable for identifying the one or more service interface specifications,
the one or more model element interface specifications are part of or are extracted from one or more executable model elements of an executable graphical model, and
the one or more service interface specifications correspond to respective services that include features complying with the one or more model element interface specifications and are associated with information necessary for implementing semantics of the one or more model elements;
analyze the information about the one or more model element interface specifications, the analyzing comprising
evaluating semantics of the one or more executable model elements within the executable graphical model;
identify, based on the analyzing, the one or more service interface specifications;
provide information representing the identified one or more service interface specifications for display for selection of a selected one of the identified one or more service interface specifications;
designate a persistent link between the selected one of the identified one or more service interface specifications and the one or more model element interface specifications, the persistent link being designated based at least in part on a storage locator specifying a service interface specification storage location accessible to a broker, and the storage locator having been registered with the broker in association with the selected one of the identified one or more service interface specifications before the selection was made; and detect that the persistent link is broken or that a change took place in the selected one of the identified one or more service interface specifications based at least in part on the storage locator.

2. The computing system of claim 1, wherein the one or more processors are configured to, in response to detecting that the persistent link is broken or that the change took place, (1) re-establish a persistent link or (2) provide information associated with a change in the selected one of the identified one or more service interface specifications, the information comprising one or more of:

information about a location of one or more services associated with the at least one of the identified one or more service interface specifications; or information about recreating the one or more services associated with the at least one of the identified one or more service interface specifications.

3. The computing system of claim 1, wherein designating a persistent link comprises storing the storage locator and a unique identifier of the selected one of the identified one or more service interface specifications such that one or more services associated with the selected one of the identified one or more service interface specifications is identifiable without using names of the services.

4. The computing system of claim 1, wherein the one or more processors are configured to:

provide notifications about changes made to the selected one of the identified one or more service interface specifications or associated services, or changes made to the one or more model element interface specifications, based on the persistent link;

provide suggestions on changes to be made to the selected one of the identified one or more service interface specifications or associated services based on changes made to the one or more model element interface specifications;

provide suggestions on changes to be made to the one or more model element interface specifications based on changes made to the selected one of the identified one or more service interface specifications or associated services;

automatically make changes to the selected one of the identified one or more service interface specifications or associated services based on changes made to the one or more model element interface specifications; or automatically make changes to the one or more model element interface specifications based on changes made to the selected one of the identified one or more service interface specifications or associated services.

5. The computing system of claim 1, wherein evaluating semantics comprises evaluating a function call prototype, parameters, blocks of the executable graphical model, subsystems of the executable graphical model, signals of the executable graphical model, or ports of the executable graphical model.

6. The computing system of claim 1, wherein the identified one or more service interface specifications and associated one or more services comprise service syntax that does not match model element syntax of the one or more model element interface specifications, and the one or more processors are configured to convert the service syntax for compatibility with the model element syntax.

7. A method comprising:

receiving, by one or more processors, a first request for one or more service interface specifications, where the first request includes information about one or more model element interface specifications usable for identifying the one or more service interface specifications, the one or more model element interface specifications are part of or are extracted from one or more executable model elements of an executable graphical model, and the one or more service interface specifications correspond to respective services that include features complying with the one or more model element interface specifications and are associated with information necessary for implementing semantics of the one or more model elements;

analyzing, by the one or more processors, the information about the one or more model element interface specifications, the analyzing comprising evaluating semantics of the one or more executable model elements within the executable graphical model;

identifying, by the one or more processors and based on the analyzing, the one or more service interface specifications;

providing information representing the identified one or more service interface specifications for display for selection of a selected one of the identified one or more service interface specifications;

designating, by the one or more processors, a persistent link between the selected one of the identified one or more service interface specifications and the one or more model element interface specifications, the persistent link being designated based at least in part on a storage locator specifying a service interface specification storage location accessible to a broker, and the storage locator having been registered with the broker in association with the selected one of the identified one or more service interface specifications before the selection was made; and detecting, by the one or more processors, that the persistent link is broken or that a change took place in the selected one of the identified one or more service interface specifications based at least in part on the storage locator.

8. The method of claim 7, wherein the one or more processors, in response to detecting that the persistent link is broken or that the change took place, (1) re-establish a persistent link or (2) provide information associated with a change in the selected one of the identified one or more service interface specifications, the information comprising one or more of:

information about a location of one or more services associated with the selected one of the identified one or more service interface specifications; or information about recreating the one or more services associated with the selected one of the identified one or more service interface specifications.

9. The method of claim 7, wherein designating a persistent link comprises storing the storage locator and a unique identifier of the selected one of the identified one or more service interface specifications such that one or more services associated with the selected one of the identified one or more service interface specifications is identifiable without using names of the services.

10. The method of claim 7, wherein the one or more processors:
provide notifications about changes made to the selected one of the identified one or more service interface specifications or associated services, or changes made to the one or more model element interface specifications, based on the persistent link;
provide suggestions on changes to be made to the selected one of the identified one or more service interface specifications or associated services based on changes made to the one or more model element interface specifications;
provide suggestions on changes to be made to the one or more model element interface specifications based on changes made to the selected one of the identified one or more service interface specifications or associated services;
automatically make changes to the selected one of the identified one or more service interface specifications or associated services based on changes made to the one or more model element interface specifications; or
automatically make changes to the one or more model element interface specifications based on changes made to the selected one of the identified one or more service interface specifications or associated services.

11. The method of claim 7, wherein evaluating semantics comprises evaluating a function call prototype, parameters, blocks of the executable graphical model, sub-systems of the executable graphical model, signals of the executable graphical model, or ports of the executable graphical model.

12. The method of claim 7, wherein the identified one or more service interface specifications and associated one or more services comprise service syntax that does not match model element syntax of the one or more model element interface specifications, and the one or more processors are configured to convert the service syntax for compatibility with the model element syntax.

13. One or more non-transitory computer-readable media, having stored thereon instructions that, when executed by a computing system, cause the computing system to perform operations comprising:
receiving, by one or more processors, a first request for one or more service interface specifications, where
the first request includes information about one or more model element interface specifications usable for identifying the one or more service interface specifications,
the one or more model element interface specifications are part of or are extracted from one or more executable model elements of an executable graphical model, and
the one or more service interface specifications correspond to respective services that include features complying with the one or more model element interface specifications and are associated with information necessary for implementing semantics of the one or more model elements;
analyzing, by the one or more processors, the information about the one or more model element interface specifications, the analyzing comprising evaluating semantics of the one or more executable model elements within the executable graphical model;
identifying, by the one or more processors and based on the analyzing, the one or more service interface specifications;
providing information representing the identified one or more service interface specifications for display for selection of a selected one of the identified one or more service interface specifications;
designating, by the one or more processors, a persistent link between the selected one of the identified one or more service interface specifications and the one or more model element interface specifications, the persistent link being designated based at least in part on a storage locator specifying a service interface specification storage location accessible to a broker, and the storage locator having been registered with the broker in association with the selected one of the identified one or more service interface specifications before the selection was made; and
detecting, by the one or more processors, that that the persistent link is broken or that a change took place in the selected one of the identified one or more service interface specifications based at least in part on the storage locator.

14. The one or more non-transitory computer-readable media of claim 13, wherein the operations further comprise, in response to detecting that the persistent link is broken or that the change took place, (1) re-establishing a persistent link or (2) providing information associated with a change in the selected one of the identified one or more service interface specifications, the information comprising one or more of:
information about a location of one or more services associated with the selected one of the identified one or more service interface specifications; or
information about recreating the one or more services associated with the selected one of the identified one or more service interface specifications.

15. The one or more non-transitory computer-readable media of claim 13, wherein designating a persistent link comprises storing the storage locator and a unique identifier of the selected one of the identified one or more service interface specifications such that one or more services associated with the selected one of the identified one or more service interface specifications is identifiable without using names of the services.

16. The one or more non-transitory computer-readable media of claim 13, wherein the operations further comprise:
providing notifications about changes made to the selected one of the identified one or more service interface specifications or associated services, or changes made to the one or more model element interface specifications, based on the persistent link;
providing suggestions on changes to be made to the selected one of the identified one or more service interface specifications or associated services based on changes made to the one or more model element interface specifications;
providing suggestions on changes to be made to the one or more model element interface specifications based on changes made to the selected one of the identified one or more service interface specifications or associated services;
automatically making changes to the selected one of the identified one or more service interface specifications or associated services based on changes made to the one or more model element interface specifications; or
automatically making changes to the one or more model element interface specifications based on changes made to the selected one of the identified one or more service interface specifications or associated services.

17. The one or more non-transitory computer-readable media of claim 13, wherein evaluating semantics comprises evaluating a function call prototype, parameters, blocks of the executable graphical model, sub-systems of the executable graphical model, signals of the executable graphical model, or ports of the executable graphical model.

\* \* \* \* \*